United States Patent
D'Andrade et al.

(10) Patent No.: US 7,776,456 B2
(45) Date of Patent: Aug. 17, 2010

(54) ORGANIC LIGHT EMITTING DEVICES WITH AN EMISSIVE REGION HAVING EMISSIVE AND NON-EMISSIVE LAYERS AND METHOD OF MAKING

(75) Inventors: Brian D'Andrade, Hamilton, NJ (US); Theodore Zhou, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 965 days.

(21) Appl. No.: 11/002,260

(22) Filed: Dec. 3, 2004

(65) Prior Publication Data
US 2006/0121309 A1 Jun. 8, 2006

(51) Int. Cl.
*H01L 51/54* (2006.01)
(52) U.S. Cl. .................. 428/690; 428/917; 427/66; 313/504; 313/506; 257/40
(58) Field of Classification Search ............... 428/690, 428/917; 313/504, 506
See application file for complete search history.

(56) References Cited

U.S. PATENT DOCUMENTS

| | | | |
|---|---|---|---|
| 4,769,292 A | 9/1988 | Tang et al. | 428/690 |
| 5,247,190 A | 9/1993 | Friend et al. | 257/40 |
| 5,601,903 A * | 2/1997 | Fujii et al. | 428/212 |
| 5,703,436 A | 12/1997 | Forrest et al. | 313/506 |
| 5,707,745 A | 1/1998 | Forrest et al. | 428/432 |
| 5,783,292 A * | 7/1998 | Tokito et al. | 428/212 |
| 5,834,893 A | 11/1998 | Bulovic et al. | 313/506 |
| 5,844,363 A | 12/1998 | Gu et al. | 313/506 |
| 6,013,982 A | 1/2000 | Thompson et al. | 313/506 |
| 6,087,196 A | 7/2000 | Sturm et al. | 438/29 |
| 6,091,195 A | 7/2000 | Forrest et al. | 313/504 |
| 6,097,147 A | 8/2000 | Baldo et al. | 313/506 |
| 6,117,567 A * | 9/2000 | Andersson et al. | 428/690 |
| 6,294,398 B1 | 9/2001 | Kim et al. | 438/22 |

(Continued)

FOREIGN PATENT DOCUMENTS

EP 1 351 558 10/2003

(Continued)

OTHER PUBLICATIONS

Baldo et al., "Very high-efficiency green organic light-emitting devices based on electrophosphorescence," Appl. Phys. Lett., vol. 75, No. 1, pp. 4-6 (1999).

(Continued)

*Primary Examiner*—Dawn Garrett
(74) *Attorney, Agent, or Firm*—Kenyon & Kenyon LLP

(57) ABSTRACT

The present invention provides an OLED with an emissive region comprising a plurality of sets of organic layers, each set comprising a non-continuous emissive layer and a neat non-emissive layer. The present invention also provides an OLED with an emissive region comprising a plurality of sets of organic layers, each set comprising an emissive layer and a neat non-emissive layer, wherein the energy gaps of the emissive layer and the non-emissive layer are not nested. The present invention also provides a method for making OLEDs by depositing on a substrate an anode, a plurality of sets of organic layers, each set comprising an emissive layer and a non-emissive layer wherein each layer is deposited sequentially, and a cathode.

43 Claims, 18 Drawing Sheets

U.S. PATENT DOCUMENTS

| | | | |
|---|---|---|---|
| 6,303,238 B1 | 10/2001 | Thompson et al. | 428/690 |
| 6,310,360 B1 | 10/2001 | Forrest et al. | 257/40 |
| 6,337,102 B1 | 1/2002 | Forrest et al. | 427/64 |
| 6,468,819 B1 | 10/2002 | Kim et al. | 438/22 |
| 6,548,956 B2 | 4/2003 | Forrest et al. | 313/504 |
| 6,576,134 B1 | 6/2003 | Agner | 210/635 |
| 6,602,540 B2 | 8/2003 | Gu et al. | 427/66 |
| 6,717,358 B1 | 4/2004 | Liao et al. | |
| 7,199,515 B2* | 4/2007 | Seo et al. | 313/504 |
| 7,345,300 B2* | 3/2008 | Qin et al. | 257/40 |
| 2002/0008233 A1* | 1/2002 | Forrest et al. | 257/40 |
| 2002/0034656 A1 | 3/2002 | Thompson et al. | 428/690 |
| 2002/0182441 A1 | 12/2002 | Lamansky et al. | 428/690 |
| 2002/0197511 A1* | 12/2002 | D'Andrade et al. | 428/690 |
| 2003/0054099 A1 | 3/2003 | Jurgensen et al. | 427/248.1 |
| 2003/0072964 A1 | 4/2003 | Kwong et al. | 428/690 |
| 2003/0197465 A1 | 10/2003 | Qiu et al. | 313/504 |
| 2003/0209972 A1* | 11/2003 | Holmes et al. | 313/504 |
| 2003/0230980 A1 | 12/2003 | Forrest et al. | 313/600 |
| 2003/0234607 A1* | 12/2003 | Kim et al. | 313/502 |
| 2003/0234608 A1* | 12/2003 | Lee et al. | 313/504 |
| 2004/0132228 A1* | 7/2004 | Magno et al. | 438/99 |
| 2004/0174116 A1 | 9/2004 | Lu et al. | 313/506 |
| 2006/0227079 A1* | 10/2006 | Kashiwabara | 345/76 |
| 2006/0231843 A1* | 10/2006 | Qin et al. | 257/79 |

FOREIGN PATENT DOCUMENTS

| | | |
|---|---|---|
| EP | 1 391 944 | 2/2004 |
| WO | WO-02/074015 | 9/2002 |
| WO | WO 03/100880 A2 * | 12/2003 |

OTHER PUBLICATIONS

Adachi et al., "Nearly 100% Internal Phosphorescent Efficiency in an Organic Light Emitting Device," J. Appl. Phys., vol. 90, No. 10, pp. 5048-5051 (2001).

Pschenitzka et al., "Excitation mechanisms in dye-doped organic light-emitting devices," Appl. Phys. Lett., vol. 79, No. 26, pp. 4354-4356 (2001).

So et al., "Quasi-Epitaxial Growth of Organic Multiple Quantum Well Structures by Organic Molecular Beam Deposition," Appl. Phys. Lett., vol. 56, No. 7, pp. 674-676 (1990).

Huang et al., "Effect of Well Number on Organic Multiple-Quantum-Well Electroluminescent Device Characteristics," Appl. Phys. Lett., vol. 73, No. 23, pp. 3348-3350 (1998).

Xie et al., "Organic Multiple-Quantum Well White Electroluminescent Devices," Synth. Metals, vol. 106, pp. 71-74 (1999).

Fujita et al., "Comparative Study of Photoluminescence Dynamics of Tris(8-hydroxyquinoline) Aluminum-Based Organic Multilayer Structures with Different Types of Energy Lineups," Jp. J. of Appl. Phys., vol. 39, pp. 5301-5309 (2000).

Qiu et al., "High-Efficiency Organic Light-Emitting Diodes with Tunable Light Emission by Using Aromatic Diamine/5,6,11,12-tetraphenylnaphthacene Multiple Quantum Wells," Appl. Phys. Lett, vol. 81, No. 19, pp. 3540-3542 (2002).

Wang et al., "Influence of Organic Quantum-Well Structure on the Electroluminescent Characteristics of Blue-Light-Emitting Diodes Based on Anthracene Derivative,," Jp. Journ. Of Appl. Phys., vol. 43, pp. L63-L65 (2004).

Baldo et al., "High Efficiency Fluorescent Organic Light-Emitting Devices Using a Phosphorescent Sensitizer," Nature, vol. 403, pp. 750-753 (2000).

Shtein et al., U.S. Appl. No. 10/233,470, filed Sep. 4, 2002, "Process and Apparatus for Organic Vapor Jet Deposition,".

Baldo et al., "Highly Efficient Phosphorescent Emission from Organic Electroluminescent Devices," Nature, vol. 395, pp. 151-154 (1998).

M. Shtein, et al., "Material transport regimes and mechanisms for growth of molecular organic thin films using low-pressure organic vapor phase deposition", *J. Appl. Phys.* 89:2, pp. 1470-1476 (Jan. 15, 2001).

Gary L. Miessler, et al., *Inorganic Chemistry*, 2nd Edition, Prentice-Hall (1998), pp. 1-3, 422-424, 442. [Aug. 1999 version].

Hill et al., "Organic semiconductor heterointerfaces containing bathocuproine", J. Appl. Phys. 86(8): 4515-4519, 1999.

International Search Report dated Apr. 25, 2006, International Application No. PCT/US2005/042433 filed Nov. 21, 2005.

* cited by examiner

ORGANIC LIGHT EMITTING DEVICES WITH AN EMISSIVE REGION HAVING EMISSIVE AND NON-EMISSIVE LAYERS AND METHOD OF MAKING

FIELD OF THE INVENTION

The present invention relates to organic light emitting devices (OLEDs), and more specifically to OLEDs with an emissive region comprising emissive and non-emissive layers.

RESEARCH AGREEMENT

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

The present invention provides an OLED with an emissive region comprising a plurality of sets of organic layers, each set comprising an emissive layer and a neat non-emissive layer. In some embodiments, the emissive layer is not continuous. In some embodiments, the energy gaps of the emissive layer and the non-emissive layer are not nested.

In another embodiment, the present invention provides a method for making an OLED by depositing on a substrate an anode, a plurality of sets of organic layers, each set comprising an emissive layer and a neat non-emissive layer wherein each layer is deposited sequentially, and a cathode.

DETAILED DESCRIPTION

Figure 1:
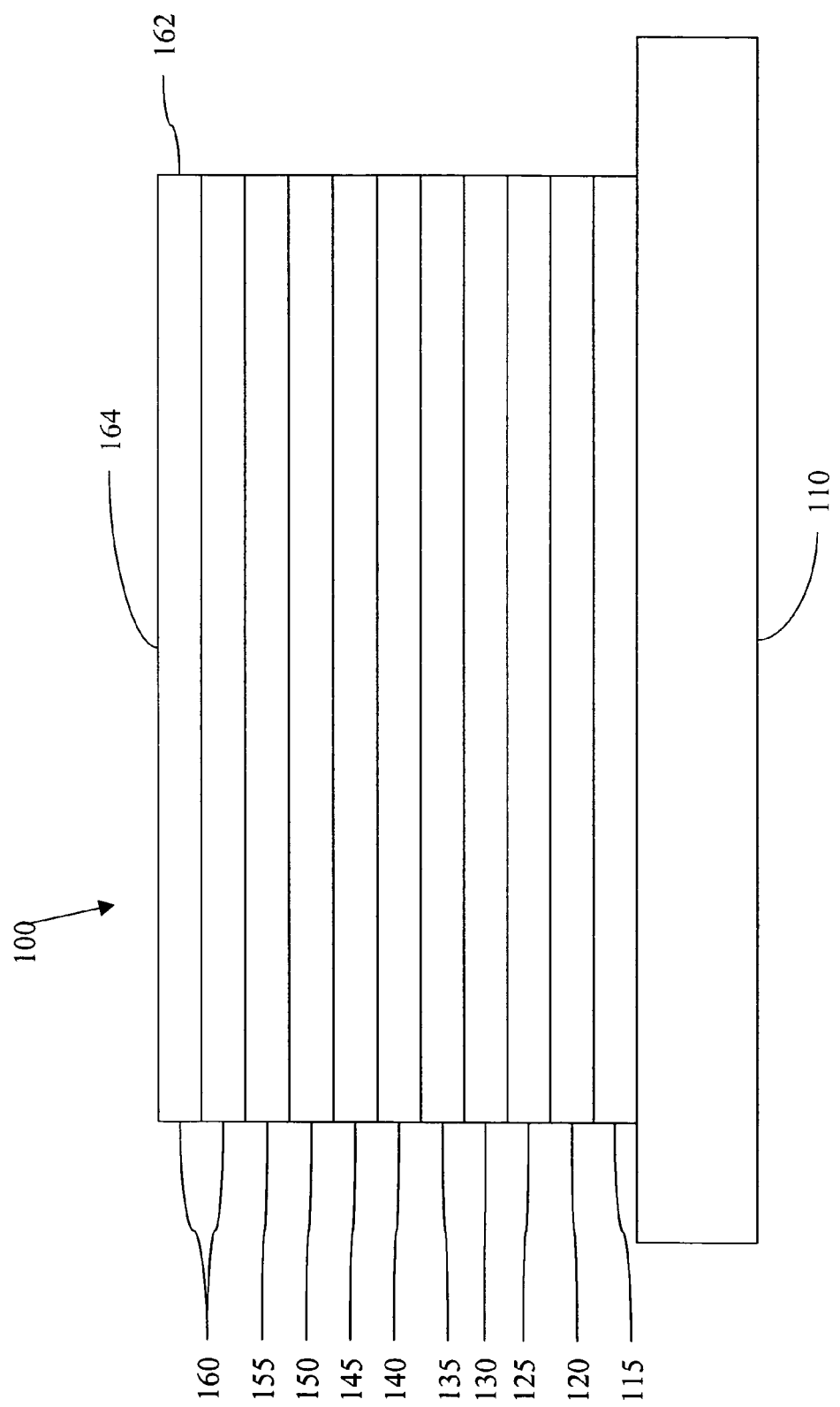
FIG. 1 shows an organic light emitting device having separate electron transport, hole transport, and emissive region, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice, organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive region 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used Emissive region 135 may include an organic material capable of emitting light when a current is passed between anode 115 and cathode 160. Preferably, emissive region 135 contains a phosphorescent emissive material, although fluorescent emissive materials may also be used. Phosphorescent materials are preferred because of the higher luminescent efficiencies associated with such materials. The emissive region may comprise layers, such as an emissive layer and a non-emissive layer. The non-emissive layer can transport electrons and/or holes. The emissive layer comprises an emissive material that may trap electrons, holes, and/or excitons, such that excitons relax from the emissive material via a photoemissive mechanism. In one embodiment of the present invention, the emissive layers are the only layers that emit light when an operating voltage is applied across the device. Whether the emissive material is a minor or a major constituent by volume percent, emissive region 135 may comprise other materials. Emissive region 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of non-emissive materials include Alq$_3$, CBP, and mCP. Examples of emissive and non-emissive materials are disclosed in U.S. Pat. No. 6,303,238 to Thompson et al., which is incorporated by reference in its entirety. Other emissive materials and structures may be used. For example, a small molecule emissive material may be present as the core of a dendrimer.

The emissive region of the present invention comprises a plurality of sets of organic layers, each set comprising an emissive layer and a neat non-emissive layer. The emissive layer comprises an emissive material, preferably a small molecule organic phosphorescent material. The non-emissive layer comprises a non-emissive material. In one embodiment, each set includes one emissive layer and one non-emissive layer such that the emissive region comprises alternating emissive and non-emissive layers. The emissive region may comprise two or more sets of emissive and non-emissive layers. In some embodiments, each emissive layer comprises the same emissive material. Similarly, in some embodiments, each non-emissive layer comprises the same non-emissive material.

The neat non-emissive layer comprises an undoped non-emissive material. The non-emissive layer may be, for example, 10-100 Å thick. When using phosphorescent emissive materials, the neat non-emissive layer preferably has thickness of about 25 Å or less. When using fluorescent emissive materials, the neat non-emissive layer preferably has thickness of about 40 Å or less. These thicknesses allow charges to jump from one emissive layer, across a neat non-emissive layer, to another emissive layer. A thicker neat non-emissive layer may make such jumping more difficult.

The emissive region also comprises an emissive layer. In some embodiments, the emissive layer is not a continuous layer, that is, there are spaces between the molecules of the emissive layer. The spaces in a non-continuous emissive layer may be empty, or they may be occupied by molecules of another layer. For example, when the emissive region comprises a non-continuous emissive layer alternating with a non-emissive layer, the non-emissive molecules of the non-emissive layer may occupy the spaces between emissive molecules in the plane of the emissive layer. A non-continuous emissive layer may have an island structure wherein groups of molecules of the emissive layer are isolated from other groups. Alternatively, a non-continuous emissive layer may have a mesh structure wherein although the layer is non-continuous, a path of adjacent emissive molecules exists from one side of the emissive layer to the other in a lateral direction. When the emissive layer is non-continuous, its "thickness" is calculated by the total thickness of the plurality of sets of organic layers within the emissive region multiplied by the volume percent of the emissive material. Accordingly, when the emissive layer is non-continuous, the "thickness" of the layer may be less than the size of a single emissive molecule, e.g., less than about 1 Å. In other embodiments, the emissive layer is a continuous layer. The emissive layer may be a monolayer, i.e., it may be one molecule in thickness. The emissive layer may also be thicker than a monolayer.

In one embodiment, the emissive region comprises an emissive layer and a neat non-emissive layer, wherein the energy gaps of the emissive layer and the non-emissive layer are not nested. Nested energy gaps are characterized by one wider energy gap enwrapping a second, narrower energy gap. In other words, one energy gap is completely overlapped by the other. In contrast, energy gaps that are not nested include energy gaps that only partially overlap (staggered energy gaps) and energy gaps that do not overlap at all. In one embodiment, the highest occupied molecular orbital level of the emissive layer is higher than the highest occupied molecular orbital level of the non-emissive layer, and the lowest unoccupied molecular orbital level of the emissive layer is higher than the lowest unoccupied molecular orbital level of the non-emissive layer.

The present invention can also be described as an OLED with an emissive region comprising a plurality of sets of organic layers, each set comprising a layer of a first organic material and a neat layer of a second organic material, wherein the energy gaps of the first organic material and the second organic material are not nested.

The present invention can be described with reference to the comparative thicknesses of the layers comprising the emissive region. Accordingly, in one embodiment, the emissive region comprises a plurality of sets of organic layers, each set comprising a layer of a first organic material and a layer of a second organic material, wherein the layer of the first organic material has a thickness of less than about 1 Å and the layer of the second organic material has a thickness of about 10 to about 100 Å.

The emissive region of the present invention comprising a plurality of sets of organic layers unexpectedly achieves comparable performance to conventional devices having a doped emissive region. The success of the present invention is unexpected because one of ordinary skill in the art would presume that confining the emissive material to a series of planes rather than the random spacing achieved by doping would increase quenching of the emissive material. See F. Pschenitzka & J. C. Sturm, "Excitation mechanisms in dye-doped organic light-emitting devices," Appl. Phys. Lett. 79, 4354 (2001). Without being bound by theory, it is believed that the emissive material in the present invention is not quenched because although the emissive molecules may be near to each other in one plane, the absence of emissive molecules above and below the plane reduces or eliminates quenching.

In addition to reducing quenching, the planar placement of the emissive material, as opposed to random placement throughout the emissive region, affects other characteristics as well. Planar placement may alter the energy levels of the layered materials. Also, planar placement may change the characteristics of the interfaces between layers. Altering the energy levels of the layers and/or altering the characteristics of the layer interfaces is one way to control the way in which charges, holes and electrons, traverse the emissive region.

Planar placement may also lend manufacturing advantages. Manufacturing a conventional doped device requires simultaneous control of both host and dopant deposition rates to maintain precise component balance during deposition and obtain the desired dopant concentration. In the present invention, the deposition rate for each component is controlled independently. The manufacturing technique of the present invention eliminates the need to continuously balance deposition rates for multiple components during simultaneous deposition and helps to improve the uniformity of the devices.

Many useful emissive materials include one or more ligands bound to a metal center. A ligand may be referred to as "photoactive" if it contributes directly to the luminescent properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels directly involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2, and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive region. An electron blocking layer 130 may be disposed between emissive region 135 and the hole transport layer 125, to block electrons from leaving emissive region 135 in the direction of hole transport layer 125. Similarly, a hole blocking layer 140 may be disposed between emissive region 135 and electron transport layer 145, to block holes from leaving emissive region 135 in the direction of electron transport layer 145. Blocking layers may also be used to block excitons from diffusing out of the emissive region. The theory and use of blocking layers is described in more detail in U.S. Pat. No. 6,097,147 and United States Patent Application Publication No. 2003-0230980 to Forrest et al., which are incorporated by reference in their entireties.

As used herein, and as would be understood by one of skill in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
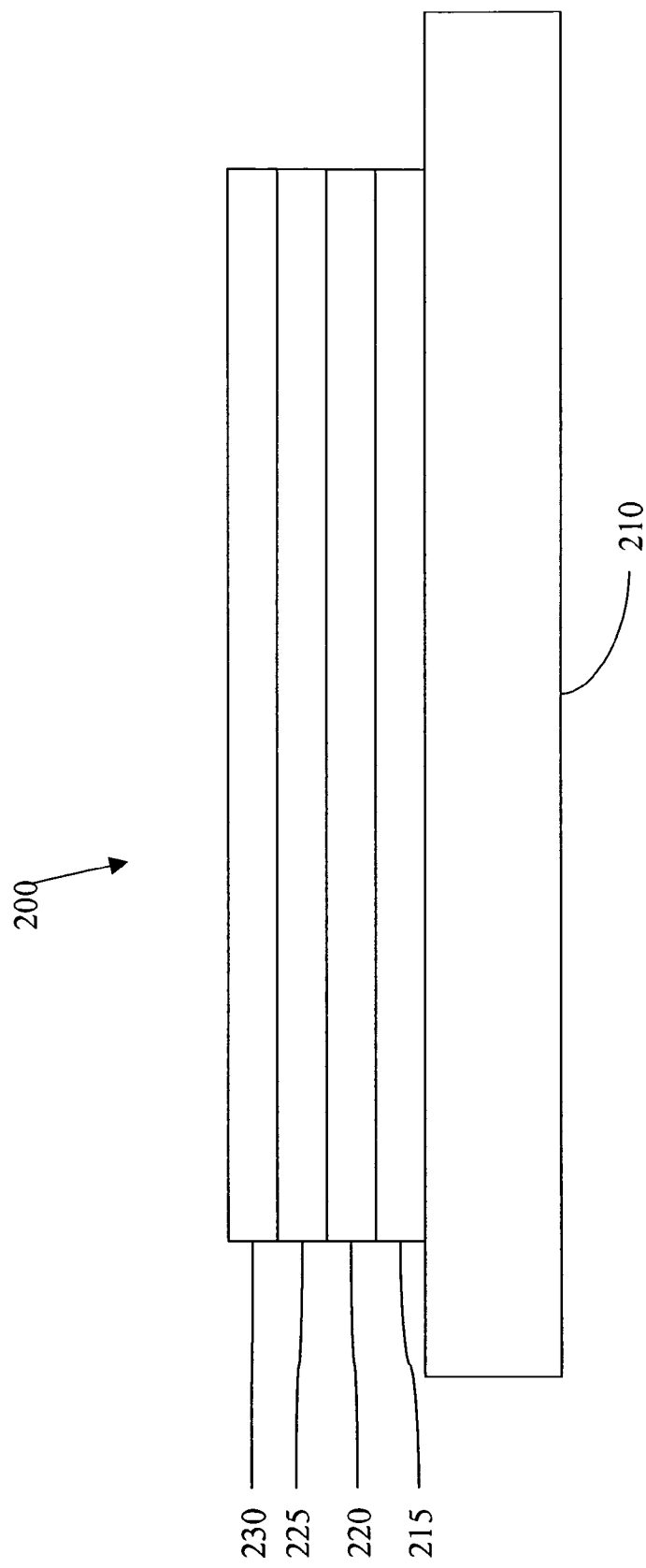
FIG. 2 shows an inverted organic light emitting device that does not have a separate electron transport layer.

FIG. 2 shows an inverted OLED 200. The device includes a substrate 210, an cathode 215, an emissive region 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used unless otherwise specified. Also, the layers may have various sublayers. The names given to the various layers herein are not intended to be strictly limiting. For example, in device 200, hole transport layer 225 transports holes and injects holes into emissive region 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18-30° C., and more preferably at room temperature (20-25° C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Organic layers in the emissive region in devices of present invention may be deposited via organic vapor phase deposition (OVPD), such as described in U.S. Pat. No. 6,337,102 to Forrest et al., which is incorporated by reference herein in its entirety. The multi-chamber tool (AIXTRON, AG, Kackertstr. 15-17, 52072 Aachen, Germany) used by the inventors herein consists of an organic vapor phase deposition (OVPD) system as disclosed in US Patent Application Publication 2003/0054099, which is incorporated by reference herein in its entirety, integrated with a vacuum robot transfer chamber, a vacuum thermal evaporation (VTE) chamber (Tokki Corporation, Kyodo Bldg., 15-5,7-Chome, Ginza Chuo-ku, Tokyo 104-0061 Japan) for deposition of high evaporation temperature organics and cathode metals, a substrate flip chamber, and a nitrogen glove box. The flip chamber enables the substrate to be transferred between the VTE (where deposition occurs upward from the organic source to the downward facing substrate to eliminate contamination from dust and flaking from the chamber walls) and OVPD (with downward deposition from source to substrate) chambers. The VTE chamber includes a resistively heated evaporation source for lithium fluoride (LiF) deposition and an e-beam source for aluminum (Al) deposition.

The computer-controlled OVPD system is comprised of remotely positioned source furnaces, gas manifolds to combine up to 10 organic sources into a single inert gas flow stream, and the deposition chamber. The organic materials are heated in independent source cells in the furnaces, thereby eliminating cross contamination. The organic vapor is transported from the source cells by preheated and purified nitrogen gas via heated lines into the deposition chamber. The deposition chamber contains a showerhead vapor distributor located several centimeters above the substrate surface that was cooled to a temperature in the range of 5 to 40° C. During OVPD, deposition chamber pressures may range from about 0.1 to about 10 Torr. In some embodiments, deposition chamber pressures preferably range from about 0.5 to about 5.0 Torr and, in other embodiments, deposition chamber pressures most preferably range from about 0.5 to about 1.0 Torr. To achieve the desired deposition rates, while overcoming the line impedances due to the remote placement of the organic source cells from the reactor vessel it is preferred to maintain a nearly 10-fold differential in upstream pressure. For example, in embodiments where the deposition chamber pressure is at 0.70±0.01 Torr, the source cell pressure is preferably maintained at about 7.50±0.01 Torr.

The proximity of the showerhead to the substrate maximizes the source utilization efficiency while maintaining a thickness uniformity to within ±2% over the 150 mm×150 mm active substrate area. The deposition rate reproducibility, defined as the standard deviation of measured thickness of 10 consecutive depositions, is also within ±2%. Since the source temperature is kept constant to within 0.5° C. of its set point, the deposition rate is primarily controlled by the carrier gas mass flow rate, thus eliminating the need for an in situ crystal thickness monitor which is required for VTE. Hence deposition rate is calibrated based on the reactor conditions, and thereafter the growth time is set to achieve the required thickness, which is checked post-growth by ellipsometry.

At a constant source temperature, the carrier gas flow rate, Q, through an individual container, determines the concentration of the organic vapor. The total flow is maintained at 1000 sccm to ensure consistent spatial thickness uniformity. Each source container is then calibrated by obtaining the dependence of deposition rate, r, on Q. The deposition rates increase with the source flow approximately linearly at low Q (<100 sccm), and sublinearly as Q is further increased. This behavior can be explained following the mass transport analysis of Shtein, et al., "Material transport regimes and mechanisms for growth of molecular organic thin films using low-pressure organic vapor phase deposition," J. of App. Physics, 89, 1470 (2001) from which we infer:

$$r = \eta \frac{P_{org}^{eq}}{RT_{cell}} \frac{Q}{1 + Q/kRT_{cell}} \quad (1)$$

Here, $\eta$ is the material utilization efficiency factor, $P_{org}^{eq}$ is the equilibrium organic vapor pressure, $T_{cell}$ is the source temperature, R is the universal gas constant, and k is the rate constant of evaporation and condensation. With experimentally determined values of $\eta$, we can estimate the equilibrium vapor pressure, $P_{org}^{eq}$, and the evaporation rate constant k from these parameters. For example, based on source consumption of 2.2±0.1 g for a total deposition 5.0±0.1 μm, $P_{org}^{eq}$ and k for Ir(ppy)$_3$ are found to be 7.7±0.4 mTorr and $4\times10^{-5}$ moles/(sec-Torr), respectively. Source calibration curves are used to choose appropriate deposition rates and time for each component material in the organic electronic device. Since the deposition rate is calibrated by thickness measurements, the amount of one deposited material relative to another deposited material in the emissive region is defined by the volume (thickness) ratio between the two materials.

Material Definitions:

As used herein, abbreviations refer to materials as follows:
α-NPD: N,N'-diphenyl-N-N'-di(1-naphthyl)-benzidine
ADN: 9,10-di-(2-naphthyl) anthracene
Alq$_3$: 8-tris-hydroxyquinoline aluminum
BAlq: aluminum(III)bis(2-methyl-8-hydroxyquinolinato)4-phenylphenolate
BCP: 2,9-dimethyl-4,7-diphenyl-1,10-phenanthroline
Bphen: 4,7-diphenyl-1,10-phenanthroline
CBP: 4,4'-N,N-dicarbazole-biphenyl
CuPc: copper phthalocyanine.
DCM: 4-(dicyanoethylene)-6-(4-dimethylaminostyryl-2-methyl)-4H-pyran
DMQA: N,N'-dimethylquinacridone
F$_4$-TCNQ: tetrafluoro-tetracyano-quinodimethane
Ir(1-piq)$_3$ tris(1-phenylisoquinoline)iridium(III)
Ir(3'-Meppy)$_3$: tris(3-methyl-2-phenylpyridine) iridium(III)
Ir(5-Phppy)$_3$ tris[5-phenyl(2-phenylpyridine)]iridium(III)
Ir(ppy)$_3$: tris(2-phenylpyridine)-iridium
Ir(ppz)$_3$: tris(1-phenylpyrazoloto,N,C(2')iridium(III)
ITO: indium tin oxide
mCP: 1,3-N,N-dicarbazole-benzene
m-MTDATA 4,4',4"-tris(3-methylphenylphenlyamino)triphenylamine
n-BPhen: n-doped BPhen (doped with lithium)
PEDOT:PSS: an aqueous dispersion of poly(3,4-ethylene-dioxythiophene) with polystyrenesulfonate (PSS)
p-MTDATA: p-doped m-MTDATA (doped with F$_4$-TCNQ)
TAZ: 3-phenyl-4-(1'-naphthyl)-5-phenyl-1,2,4-triazole
TBP 2,5,8,11-tetra-t-butylperylene
TPD: N,N'-diphenyl-N-N'-di(3-toly)-benzidine
2,6'-DCN 2,6-N,N-dicarbazolenaphthalene
2,7-DCP 2,7-N,N-dicarbazolephenanthrene
3,3'-DC-o-TerP 3,3'-dicarbazole-o-terphenyl
4,4'-DC-o-TerP 4,4'-dicarbazole-o-terphenyl

EXPERIMENTAL

Specific representative embodiments of the invention will now be described, including how such embodiments may be made. It is understood that the specific methods, materials, conditions, process parameters, apparatus and the like do not necessarily limit the scope of the invention.

The devices and methods used in the following experiments are described in greater detail in U.S. Patent Application Publication No. 2003/0054099, which is incorporated by reference in its entirety.

Device Fabrication and Measurement

All devices were fabricated on pre-patterned and pre-cleaned indium tin oxide (ITO) coated glass substrates. The ITO formed the anode electrode with a thickness of ~1200 Å. Organic stack structures for Example Devices 1-9 (fluorescent devices having multiple neat/emissive layer sets) and Comparative Example Devices 1-3 (conventionally doped fluorescent devices) are summarized in Table 1. Organic stack structures for Example Devices 10 and 11 (phosphorescent multiple neat/emissive layer devices) and Comparative Example Devices 4-7 (conventionally dopes phosphorescent devices) are summarized in Table 2.

TABLE 1

Fluorescent Organic Stack Structures

| ID | Structure |
|---|---|
| Example 1 | 2271 | 100 Å CuPc/500 Å α-NPD/[27 Å(2.6 vol. % TBP over 97.4 vol. % ADN)] × 11/400 Å Alq$_3$ |
| Example 2 | 2274 | 100 Å CuPc/500 Å α-NPD/[16 Å 2.6 vol. % TBP over 97.4 vol. % ADN)] × 19/400 Å Alq$_3$ |
| Example 3 | 2276 | 250 Å CuPc/500 Å α-NPD/[27 Å(2.6 vol. % TBP over 97.4 vol. % ADN)] × 11/400 Å Alq$_3$ |
| Example 4 | 2277 | 250 Å CuPc/500 Å α-NPD/[27 Å(2.6 vol. % TBP over 97.4 vol. % ADN)] × 11/400 Å Balq |
| Example 5 | 2286 | 250 Å CuPc/500 Å α-NPD/[27 Å(1.7 vol. % TBP over 98.3 vol. % ADN)] × 11/400 Å Balq |
| Example 6 | 2287 | 250 Å CuPc/500 Å α-NPD/[27 Å 1.0 vol. % TBP over 99.0 vol. % ADN)] 11/400 Å Balq |
| Example 7 | 2288 | 250 Å CuPc/500 Å α-NPD/[41 Å(1.7 vol. % TBP over 98.3 vol. % ADN)] × 7/400 Å Balq |
| Example 8 | 2289 | 250 Å CuPc/500 Å α-NPD/[41 Å(1.7 vol. % TBP over 99.0 vol. % ADN)] × 7/100 Å Balq/300 Å Alq$_3$ |
| Example 9 | 2290 | 250 Å CuPc/500 Å α-NPD/[27 Å(1.0 vol. % TBP over 99.0 vol. % ADN)] × 11/100 Å BAlq/300 Å Alq$_3$ |
| Comparative Example 1 | 2283 | 250 Å CuPc/500 Å α-NPD/300 Å ADN doped @ 3.3% TBP/400 Å Alq$_3$ |
| Comparative Example 2 | 2284 | 250 Å CuPc/500 Å α-NPD/300 Å ADN doped @ 2.4% TBP/400 Å Alq$_3$ |
| Comparative Example 3 | 2285 | 250 Å CuPc/500 Å α-NPD/300 Å ADN doped @ 1.7% TBP/400 Å Alq$_3$ |

TABLE 2

Phosphorescent Organic Stack Structures

| ID | Structure |
|---|---|
| Example 10 CBP/Ir(ppy)$_3$ | 2029 | 100 Å CuPc/300 Å α-NPD/[25 Å (4.3 vol. % Ir(ppy)$_3$ over 95.7 vol. % CBP)] × 12/100 Å BAlq/400A Alq$_3$ |
| Example 11 Ir(ppy)$_3$/CBP | 2028 | 100 Å CuPc/300 Å α-NPD/[25 Å (95.7 vol. % CBP over 4.3 vol. % Ir(ppy)$_3$)] × 12/100 Å BAlq/400A Alq$_3$ |
| Comparative Example 4 | 2027 | 100 Å CuPc/300 Å α-NPD/300 Å CBP doped with 4.3 vol. % Ir(ppy)$_3$/100 Å BAlq/400 Å Alq$_3$ |
| Comparative Example 5 | 2015 | 100 Å CuPc/300 Å α-NPD/300 Å CBP doped with 4.3 vol. % Ir(ppy)$_3$/100 Å BAlq/400 Å Alq$_3$ |
| Comparative Example 6 | 1981 | 100 Å CuPc/300 Å α-NPD/300 Å CBP doped with 4.3 vol. % Ir(ppy)$_3$/100 Å BAlq/400 Å Alq$_3$ |
| Comparative Example 7 | 1983 | 100 Å CuPc/300 Å α-NPD/300 Å CBP doped with 4.3 vol. % Ir(ppy)$_3$/100 Å BAlq/400 Å Alq$_3$ |

In Examples 1-11 and Comparative Examples 1-7, all organic layers were sequentially deposited by OVPD with the exception of the CuPc layer, which was deposited by VTE at a base pressure of $5\times10^{-8}$ Torr, since the OVPD source cells were configured for materials with low-to-moderate evaporation temperatures (270-310° C.) and CuPc requires a source temperature of >400° C. The cathode consisted of 8-10 Å thick LiF, followed by 1000 Å thick Al, both deposited by VTE in the same chamber used for the CuPc.

Devices having alternating neat non-emissive and non-continuous emissive layers in the emissive region and devices having a single doped emissive layer in the emissive region were fabricated and compared. Operational lifetests were performed at constant direct current at room temperature.

Fluorescent Devices

In the devices of Examples 1-9 the organic stack consisted of, sequentially from the ITO surface, CuPc as a hole injection layer (HIL); α-NPD as a hole transport layer (HTL); an emissive region consisting of a plurality (n) of layer sets ("[ADN/TBP]$_n$"), each [ADN/TBP] layer set consisting of a thin neat layer of ADN and a non-continuous layer of TBP; an electron transport layer (ETL) of Alq$_3$ (Examples 1-3) or BAlq (Examples 4-7) or first and second electron transport layers (ETL, ETL 2) consisting of a layer of Alq$_3$ and a layer of BAlq. Layer and layer set thicknesses are given in Table 1. In Comparative Examples 1-3, the organic stack was fabricated to consist of, sequentially from the ITO surface, 250 Å CuPc as a hole injection layer (HIL); 500 Å α-NPD as a hole transport layer (HTL); ADN doped with 3.3, 2.4, or 1.7 vol. % (Comparative Examples 1-3 respectively) of the dopant emitter TBP as the emissive layer at a thickness of 300 Å. Adjacent to the emissive layer in Comparative Examples 1-3 was an electron transport layer (ETL) consisting of 400 Å Alq$_3$.

Example 1

The Glass/ITO substrate was mounted with the ITO film facing down with a shadow mask in the glove box, and then transferred by robot arms into the VTE chamber for the CuPc deposition. A 100 Å thick layer of CuPc was deposited on the ITO side by VTE at a base pressure of $5\times10^{-8}$ Torr.

After deposition of the CuPc layer, the substrate was flipped face upward, and transferred to the OVPD chamber for the depositions of all other organic films. During OVPD deposition, the substrate was cooled to a temperature of 25° C. The first organic layer deposited by OVPD on the CuPc surface was a 500 Å thick layer of α-NPD. Specifically, α-NPD vapor was carried from an α-NPD source cell to the substrate via nitrogen carrier gas. The α-NPD growth conditions included a source temperature of 267±0.1° C., a carrier gas flow rate of 300 sccm, and a growth time of 581 seconds. The α-NPD layer was grown to a thickness of ~500 Å.

After deposition of the α-NPD layer, multiple thin layer sets of ADN/TPD were deposited. Specifically, after shutting off the corresponding carrier gas flow for the α-NPD layer, a separate nitrogen carrier line was turned on to carry ADN vapor from the ADN source cell into the deposition chamber. The ADN growth conditions included a source temperature of 267.4±0.1° C. and a carrier gas flow rate of 180 sccm. After a growth time of 10 seconds, the corresponding carrier gas flow was shut off. Thus, a first neat layer of ADN was formed. Then, a non-continuous layer of TBP was deposited over the neat layer of ADN by turning on a separate nitrogen carrier line to carry TBP vapor from the TBP source cell into the deposition chamber. The TBP growth conditions included a source temperature of 199±0.1° C. and a carrier gas flow rate of 40 sccm. After a TBP growth time of 3 seconds, the corresponding carrier gas flow was shut off, thereby completing a first ADN/TBP layer set, the first ADN/TBP layer set having a thickness of ~27 Å and comprising 97.4% ADN and 2.6% TBP by volume. Subsequent ADN/TBP sets were deposited in the same manner until a total of 11 ADN/TBP layer sets had been formed, each set comprising 97.4 vol. % ADN and 2.6 vol. % TBP, and each layer set having a total ADN/TBP thickness of ~27 Å. Together, the 11 ADN/TBP layer sets formed an emissive region having an accumulated thickness of ~297 Å.

After deposition of the last ADN/TBP set, an electron transporting layer of Alq$_3$ (the last organic layer) was deposited by turning on a separate nitrogen line to carry Alq$_3$ vapor from the Alq$_3$ container into the deposition chamber. The Alq$_3$ layer was grown to a thickness of ~400 Å. The Alq$_3$ growth conditions included a source temperature of 295.3±0.1° C., a carrier gas flow rate of 200 sccm, and a growth time of 178 seconds.

After deposition of the last organic layer, the substrate was removed from the OVPD reactor, and it was again flipped face downward. The shadow mask exchange was performed in the flip chamber, followed by the deposition of the LiF/Al cathode layers in the VTE chamber. There was no vacuum break until the completed OLED was transferred back into the glove box for encapsulation. The encapsulation was provided by a desiccant-loaded cover glass attached to the substrate by a UV curable epoxy perimeter seal.

Example 2

The fabrication process for Example 2 was the same as for Example 1 except that the ADN/TPD layer set growth conditions included an ADN growth time of 6 seconds and a TBP growth time of 2 seconds. A total of 19 ADN/TBP sets were formed, each set having an ADN/TBP thickness of ~16 Å and comprising ~97.4% ADN and ~2.6% TBP by volume. Together, the 19 ADN/TBP sets formed an emissive region having an accumulated thickness of ~0.304 Å.

Example 3

The fabrication process for Example 3 was the same as for Example 1 except that the CuPc layer was grown to a thickness of ~250 Å.

Example 4

The fabrication process for Example 4 was the same as for Example 3 except that a layer of BAlq was deposited as an electron transport layer instead of Alq$_3$. The BAlq layer was grown to a thickness of ~400 Å. The BAlq growth conditions included a source temperature of 266±0.1° C., a carrier gas flow rate of 200 sccm, and a growth time of 93 seconds.

Example 5

The fabrication process for Example 5 was the same as for Example 4 except that the ADN/TPB set growth conditions included an ADN growth time of 10 seconds, a TBP flow rate of 15 sccm, and a TBP growth time of 5 seconds. A total of 11 ADN/TBP sets were thereby formed, each set having a total ADN/TBP thickness of ~27 Å and comprising 98.3 vol. % ADN and 1.7 vol. % TBP.

Example 6

The fabrication process for Example 6 was the same as for Example 5 except that the ADN/TPB layer set growth conditions included a TBP growth time of 3 seconds. A total of 11 ADN/TBP layer sets were thereby formed, each layer set having a total ADN/TBP thickness of ~27 Å and comprising 99.0 vol. % ADN and 1.0 vol. % TBP.

Example 7

The fabrication process for Example 7 was the same as for Example 4 except that the ADN/TPD layer set growth conditions included an ADN growth time of 15 seconds and a TBP growth time of 3 seconds. A total of seven ADN/TBP layer sets were thereby formed, each set having a total ADN/TBP thickness of ~41 Å and comprising 98.3 vol. % ADN and 1.7 vol. % TBP.

Example 8

The fabrication process for Example 8 was the same as for Example 7 except that instead of depositing a 400 Å thick layer of BAlq, a 100 Å thick layer of BAlq was deposited, followed by a 300 Å thick layer of Alq$_3$.

Example 9

The fabrication process for Example 9 was the same as for Example 6 except that instead of depositing a 400 Å thick layer of BAlq, a 100 Å thick layer of BAlq was deposited, followed by a 300 Å thick layer of Alq$_3$.

Comparative Examples 1-3

The fabrication process for Comparative Examples 1-3 was the same as for Example 3 except that after deposition of the NPD layer, a ~300 Å thick layer of ADN doped with 3.3 vol. % TBP (Comparative Example 1), 2.4 vol. % TBP (Comparative Example 2), or 1.7 vol. % TBP (Comparative Example 3) was grown. The doped layer was grown by allowing carrier gas to flow through the ADN and the TBP containers simultaneously. The growth conditions for the doped layer included a growth time of 114 seconds, an ADN carrier gas flow rate of 180 sccm, and a TBP carrier gas flow of 15 sccm (Comparative Example 1), 10 sccm (Comparative Example 2), or 7 sccm (Comparative Example 3).

Phosphorescent Devices

In Example Devices 10 and 11, the organic stack was fabricated to consist of, sequentially from the ITO surface, 100 Å CuPc as a hole injection layer (HIL); 300 Å NPD as a hole transport layer (HTL); a plurality of sets of 4,4'-N,N-dicarbazole-biphenyl ("CBP") and tris(2 phenylpyridine) iridium ("Ir(ppy)$_3$"), each set including a neat CBP thin film and a non-continuous Ir(ppy)$_3$ layer [CBP+Ir(ppy)$_3$] as the emissive region; first and second electron transport layers (ETL, ETL 2) consisting of a 400 Å layer of Alq$_3$ deposited over a 100 Å layer of BAlq. The ratio (in vol. %) of CBP:Ir(ppy)$_3$ in each neat film/non-continuous layer set and the number of sets in the emissive region of each device are given in Table 2.

In Comparative Example Devices 4-7 (conventional doped phosphorescent devices), the organic stack was fabricated to consist of, sequentially from the ITO surface, 100 Å CuPc as a hole injection layer (HIL); 300 Å NPD as a hole transport layer (HTL); CPB doped with 4.3 vol. % of the dopant emitter Ir(ppy)$_3$ as the emissive layer at a thickness of 300 Å; first and second electron transport layers (ETL, ETL 2) consisting of a 400 Å layer of Alq$_3$ and a 100 Å thick layer of BAlq.

Example 10

Glass/ITO substrate was mounted with the ITO film facing down with a shadow mask in the glove box, and then transferred by robot arms into the VTE chamber for the CuPc deposition. A 100 Å thick layer of CuPc was deposited on the ITO side by VTE at a base pressure of 5×10$^{-8}$ Torr.

After deposition of the CuPc layer, the substrate was flipped face upward, and transferred to the OVPD chamber for the depositions of all other organic films. During OVPD deposition, the substrate was cooled to a temperature of 25° C. The first organic layer deposited by OVPD on the CuPc surface was a 300 Å thick layer of α-NPD. Specifically, α-NPD vapor was carried from an α-NPD source cell to the substrate via nitrogen carrier gas. The α-NPD growth conditions included a source temperature of 272-275° C., a carrier gas flow rate of 300 sccm, and a growth time of 222 seconds.

After deposition of the α-NPD layer, multiple thin layer sets of alternating neat CBP and non-continuous Ir(ppy)$_3$ were then deposited. Specifically, a first neat layer of CBP was deposited over the first neat layer of Ir(ppy)$_3$ by turning on a separate nitrogen carrier line to carry CBP vapor from the CBP source cell into the deposition chamber. The CBP growth conditions included a source temperature of 293.2±0.1° C. and a carrier gas flow rate of 150 sccm. After a CBP growth time of 4 seconds, the corresponding carrier gas flow was shut off. Then, a first non-continuous layer of Ir(ppy)$_3$ was grown by turning on a separate nitrogen carrier line to carry Ir(ppy)$_3$ vapor from an Ir(ppy)$_3$ container into the deposition chamber. The Ir(ppy)$_3$ growth conditions included a source temperature of 294.6±0.1° C. and a carrier gas flow rate of 45 sccm. After an Ir(ppy)$_3$ growth time of 4 seconds, the corresponding carrier gas flow was shut off, thereby completing a first CBP/Ir(ppy)$_3$ set having a thickness of ~25 Å and comprising 95.7% CBP and 4.3% Ir(ppy)$_3$ by volume.

The same process steps employed in depositing the first CBP/Ir(ppy)$_3$ set were repeated, and subsequent CBP/Ir(ppy)$_3$ sets were deposited until a total of 12 CBP/Ir(ppy)$_3$ layer sets had been formed, each layer set comprising 95.7 vol. % CBP and 4.3 vol. % TBP, and each neat-nonemissive/non-continuous-emissive layer set having a total CBP/Ir(ppy)$_3$ thickness of ~25 Å. Together, the 12 CBP/Ir(ppy)$_3$ layer sets formed an emissive region having an accumulated thickness of ~300 Å.

After deposition of the last CBP/Ir(ppy)$_3$ layer set, an electron transporting layer of BAlq was deposited by allowing a separate nitrogen line to carry BAlq vapor from a BAlq container into the deposition chamber. The BAlq layer was grown to a thickness of ~100 Å. The BAlq growth conditions included a source temperature of 272±0.1° C., a carrier gas flow rate of 50 sccm, and a growth time of 29 seconds.

After deposition of the BAlq layer, a layer of Alq$_3$ (the last organic layer) was deposited by turning on a separate nitrogen line to carry Alq$_3$ vapor from an Alq$_3$ container into the deposition chamber. The Alq$_3$ layer was grown to a thickness of ~300 Å. The Alq$_3$ growth conditions included a source temperature of 292.8±0.1° C., a carrier gas flow rate of 300 sccm, and a growth time of 119 seconds.

After deposition of the last organic layer, the substrate was removed from the OVPD reactor, and it was again flipped face downward. The shadow mask exchange was performed in the flip chamber, followed by the deposition of the LiF/Al cathode layers in the VTE chamber. There was no vacuum break until the completed OLED was transferred back into the glove box for encapsulation. The encapsulation was provided by a desiccant-loaded cover glass attached to the substrate by a UV curable epoxy perimeter seal.

Example 11

Example 11 was fabricated in the same matter as Example 10 except that after deposition of the α-NPD layer, a non-continuous layer of Ir(ppy)$_3$ was the first material deposited in the emissive region, and a first neat layer of CBP was deposited over the first non-continuous layer of Ir(ppy)$_3$ to form a first Ir(ppy)$_3$/CBP layer set. The same process steps employed in depositing the first Ir(ppy)$_3$/CBP layer set were repeated, and subsequent Ir(ppy)$_3$/CBP layer sets were deposited until a total of 12 Ir(ppy)$_3$/CBP layer sets had been formed, each layer set comprising 4.3 vol. % Ir(ppy)$_3$ and 95.7 vol. % CBP. Each Ir(ppy)$_3$/CBP layer set had a total Ir(ppy)$_3$/CBP thickness of ~25 Å. Together, the 12 r(ppy)$_3$/CBP layer sets formed an emissive region having an accumulated thickness of ~300 Å.

Comparative Examples 4-7

The fabrication process for Comparative Examples 4-7 was the same as for Examples 10 and 11 except that after deposition of the NPD layer, a ~300 Å thick emissive layer of CBP doped with 4.3 vol. % Ir(ppy)$_3$ was deposited. For the phosphorescent emissive region of Comparative Examples 4-7, CBP and Ir(ppy)$_3$ were allowed to be transported simultaneously and combined in the vapor phase in a small mixing volume placed at the input to the showerhead, thus enabling a homogenous blending of the host (CBP) and multiple dopant molecules (Ir(ppy)$_3$) before they reached the substrate. Since the deposition rate is calibrated by thickness measurements, the doping concentration in emissive regions deposited by OVPD is defined by the volume ratio between the host and dopant as opposed to the weight percentage conventionally used for VTE. In comparative Examples 4-7, 4.3 vol. % Ir(ppy)$_3$ doped in CBP corresponds to a weight percentage of 6%.

Device Characteristics

The luminous efficiency and external quantum efficiency of Example Devices 1-9 and Comparative Example Devices 1-3 were measured and are summarized in Table 3. The luminous efficiency and external quantum efficiency of Example Devices 10-11 and Comparative Example Devices 4-7 were measured and are summarized in Table 4.

TABLE 3

| | | Fluorescent Device Characteristics | | | | |
|---|---|---|---|---|---|---|
| Device ID | EML thickness | EML vol. % TBP (eq. wt %) | ETL2 thickness | ETL1 thickness | Luminous efficiency @1000 cd/m$^2$ (cd/A) | External quantum efficiency @1000 cd/m$^2$ (%) |
| Example 1 | 27 Å × 11 = 297 Å | 2.6% | n/a | Alq$_3$ (400 Å) | 2.53 | 1.15 |

TABLE 3-continued

Fluorescent Device Characteristics

| Device ID | EML thickness | EML vol. % TBP (eq. wt %) | ETL2 thickness | ETL1 thickness | Luminous efficiency @1000 cd/m$^2$ (cd/A) | External quantum efficiency @1000 cd/m$^2$ (%) |
|---|---|---|---|---|---|---|
| Example 2 | 16 Å × 19 = 304 Å | 2.6% | n/a | Alq$_3$ (400 Å) | 2.33 | 1.07 |
| Example 3 | 27 Å × 11 = 297 Å | 2.6% | n/a | Alq$_3$ (400 Å) | 2.46 | 1.14 |
| Example 4 | 27 Å × 11 = 297 Å | 2.6% | n/a | Balq (400 Å) | 2.68 | 1.36 |
| Example 5 | 27 Å × 11 = 297 Å | 1.7% | n/a | Balq (400 Å) | 2.87 | 1.52 |
| Example 6 | 27 Å × 11 = 297 Å | 1.0% | n/a | Balq (400 Å) | 3.24 | 1.69 |
| Example 7 | 41 (Å) × 7 = 287 Å | 1.7% | n/a | BAlq (400 Å) | 3.54 | 1.90 |
| Example 8 | 41 Å × 7 = 287 Å | 1.7% | BAlq (100 Å) | Alq$_3$ (300 Å) | 2.71 | 1.41 |
| Example 9 | 27 Å × 11 = 297 Å | 1.0% | BAlq (100 Å) | Alq$_3$ (300 Å) | 3.06 | 1.62 |
| Comparative Example 1 | 300 Å × 1 = 300 Å | 3.3 | n/a | Alq$_3$ (400 Å) | 2.54 | 1.22 |
| Comparative Example 2 | 300 Å × 1 = 300 Å | 2.4 | n/a | Alq$_3$ (400 Å) | 2.85 | 1.37 |
| Comparative Example 3 | 300 Å × 1 = 300 Å | 1.7 | n/a | Alq$_3$ (400 Å) | 2.82 | 1.36 |

TABLE 4

Phosphorescent Device Characteristics

| | EMR (thickness) | EMR (vol. % Ir(ppy)$_3$) | ETL2 (material and thickness) | ETL (material and thickness) | Luminous efficiency at 1000 cd/m$^2$ (cd/A) | External quantum efficiency at 1000 cd/m$^2$ (%) |
|---|---|---|---|---|---|---|
| Example 10 | 25 Å × 12 = 300 Å | 4.3 | Balq (100 Å) | Alq$_3$ (400 Å) | 25.7 | 7.3 |
| Example 11 | 25 Å × 12 = 300 Å | 4.3 | Balq (100 Å) | Alq$_3$ (400 Å) | 25.6 | 7.2 |
| Comparative Example 4 | 300 Å × 1 = 300 Å | 4.3 | BAlq (100 Å) | Alq$_3$ (400 Å) | 23.2 | 6.6 |
| Comparative Example 5 | 300 Å CBP · 4.3% Irppy | 4.3 | Balq (100 Å) | Alq$_3$ (400 Å) | 24.8 | 6.9 |
| Comparative Example 6 | 300 Å CBP · 4.3% Irppy | 4.3 | Balq (100 Å) | Alq$_3$ (400 Å) | 25.4 | 7.2 |
| Comparative Example 7 | 300 Å CBP · 4.3% Irppy | 4.3 | Balq (100 Å) | Alq$_3$ (400 Å) | 25.0 | 7.0 |

The device characteristics are also depicted by FIGS. 1-18.

Figure 3:
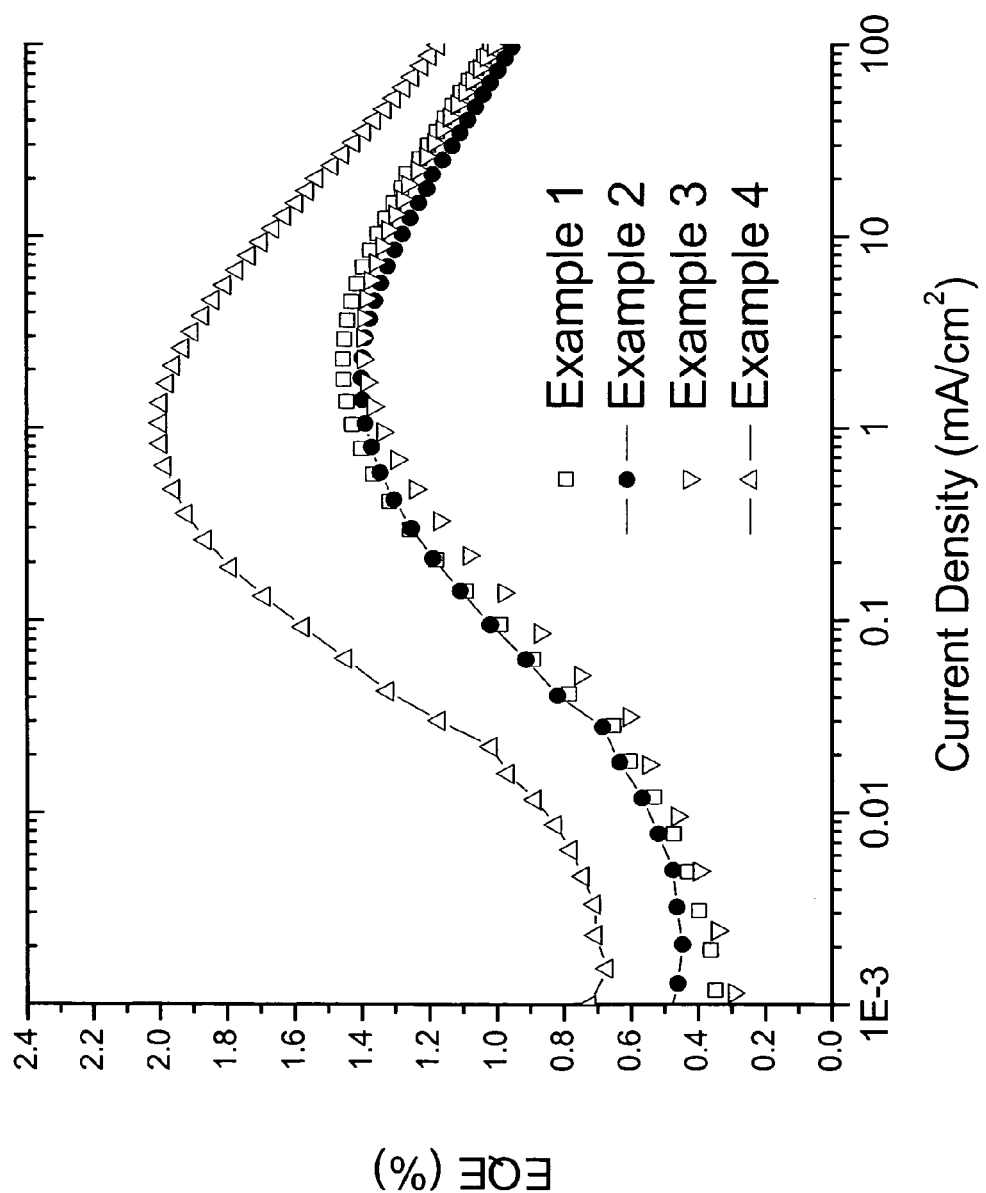
FIG. 3 shows the external quantum efficiency ($\eta_{ext}$) as a function of current density (mA/cm$^2$) for Example Devices 1-4.
Figure 4:
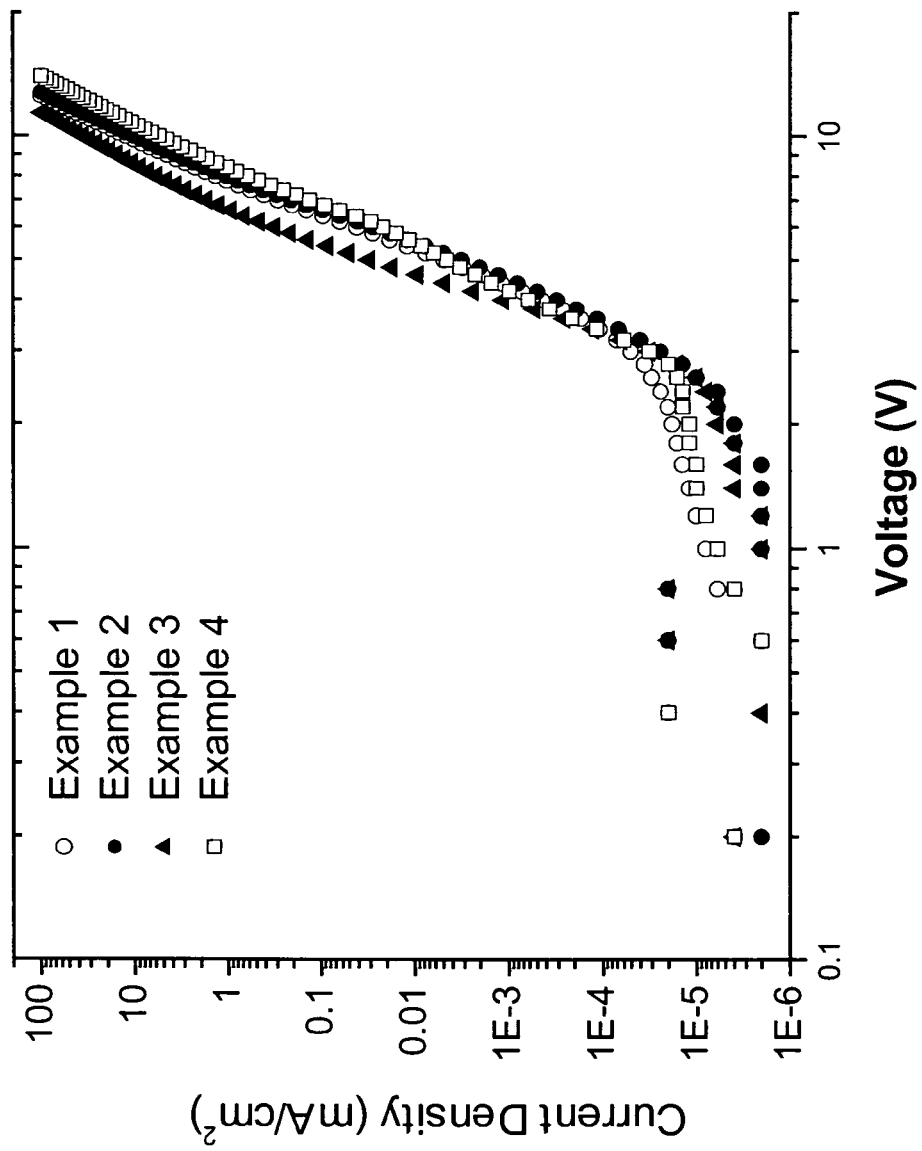
FIG. 4 shows plots comparing current density (mA/cm$^2$) vs. voltage (V) in Example Devices 1-4.
Figure 5:
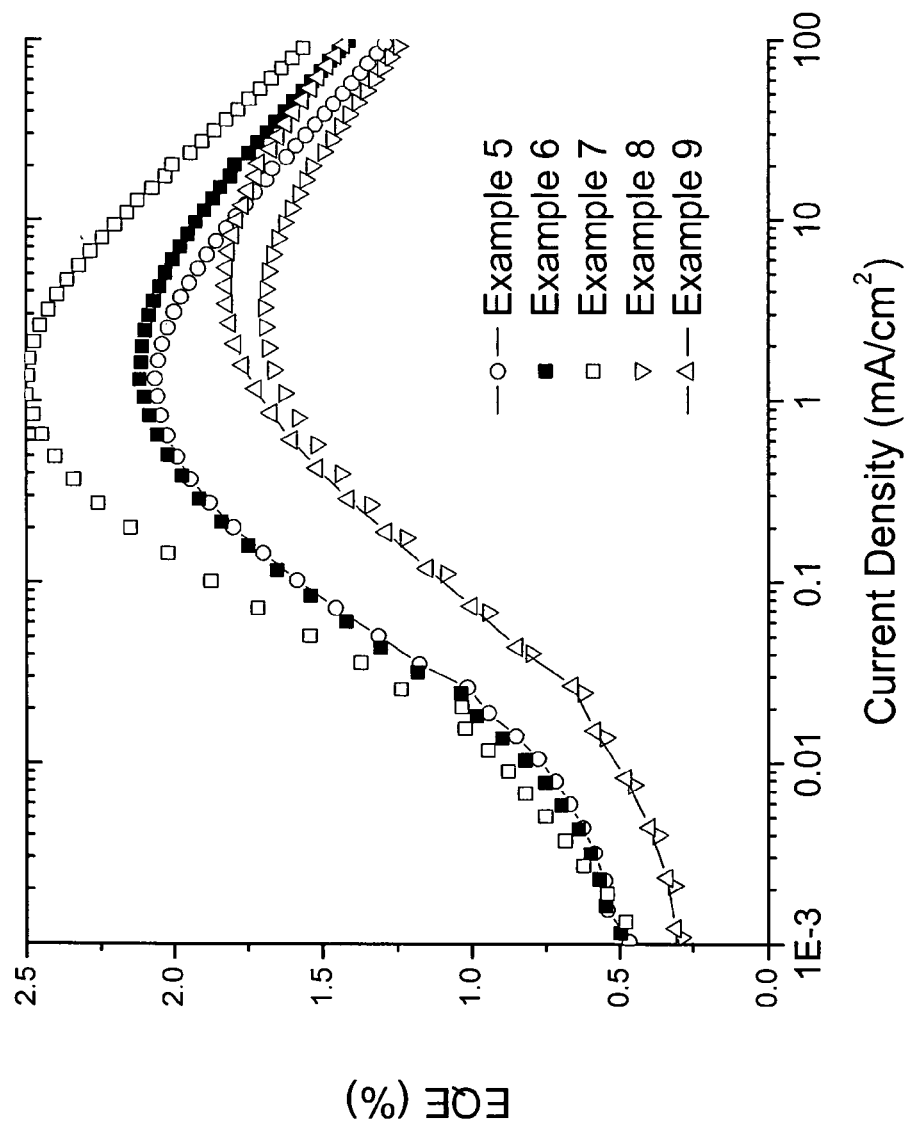
FIG. 5 shows the external quantum efficiency ($\eta_{ext}$) as a function of current density (mA/cm$^2$) for Example Devices 5-9.
Figure 6:
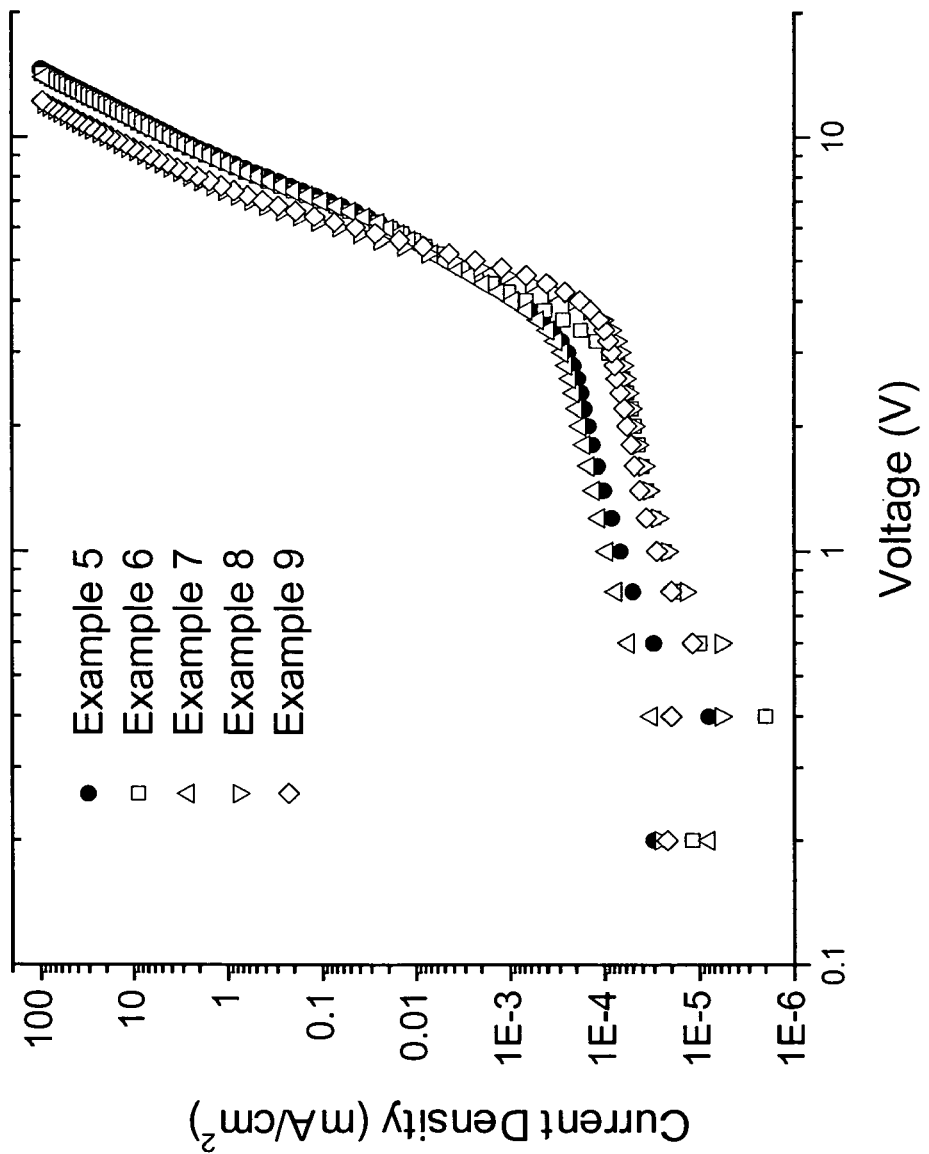
FIG. 6 shows plots comparing current density (mA/cm$^2$) vs. voltage (V) in Example Devices 5-9.
Figure 7:
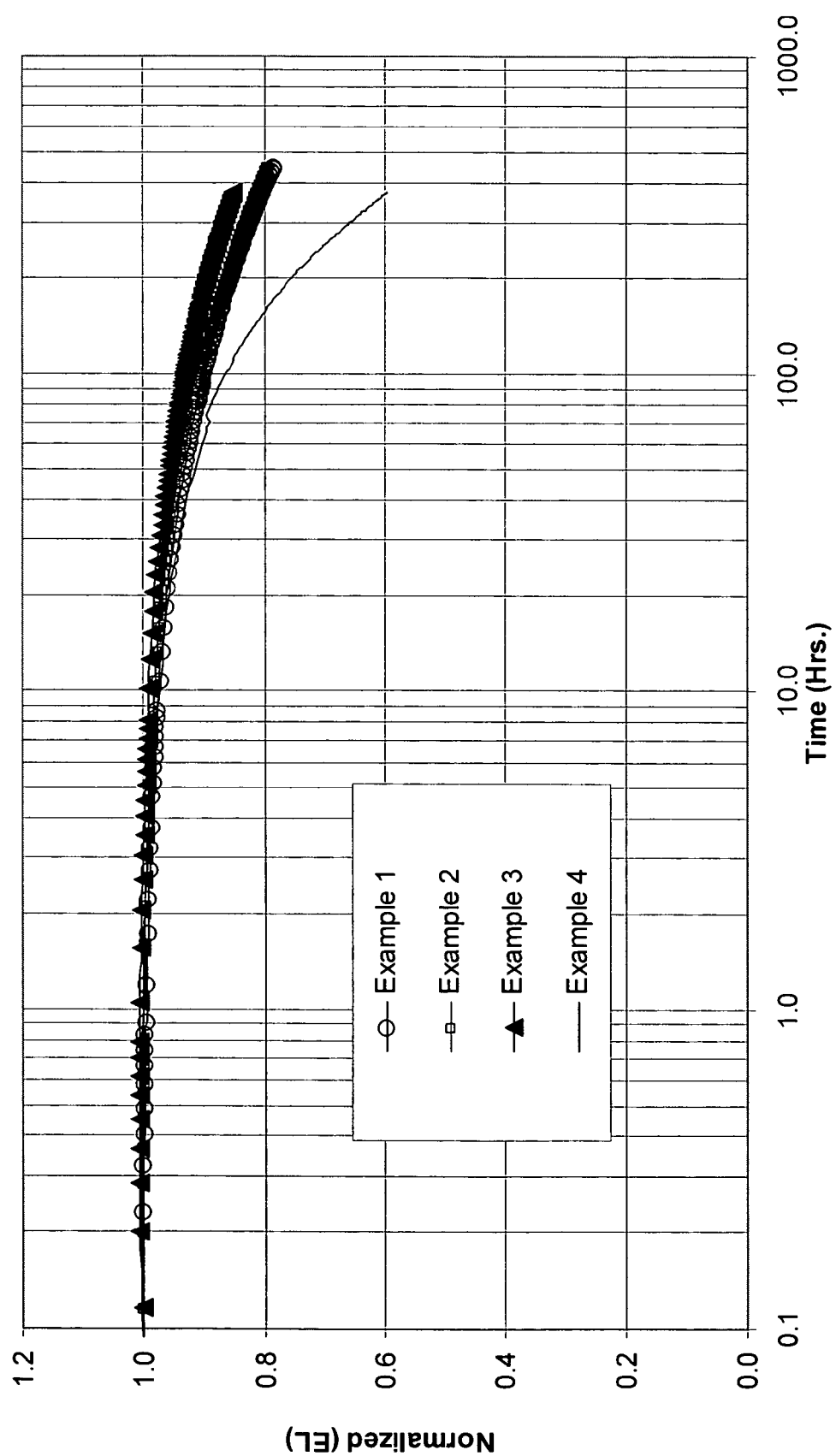
FIG. 7 shows normalized luminance decay for Example Devices 1-4 under constant current drive of 40 mA/cm$^2$ at room temperature.
Figure 8:
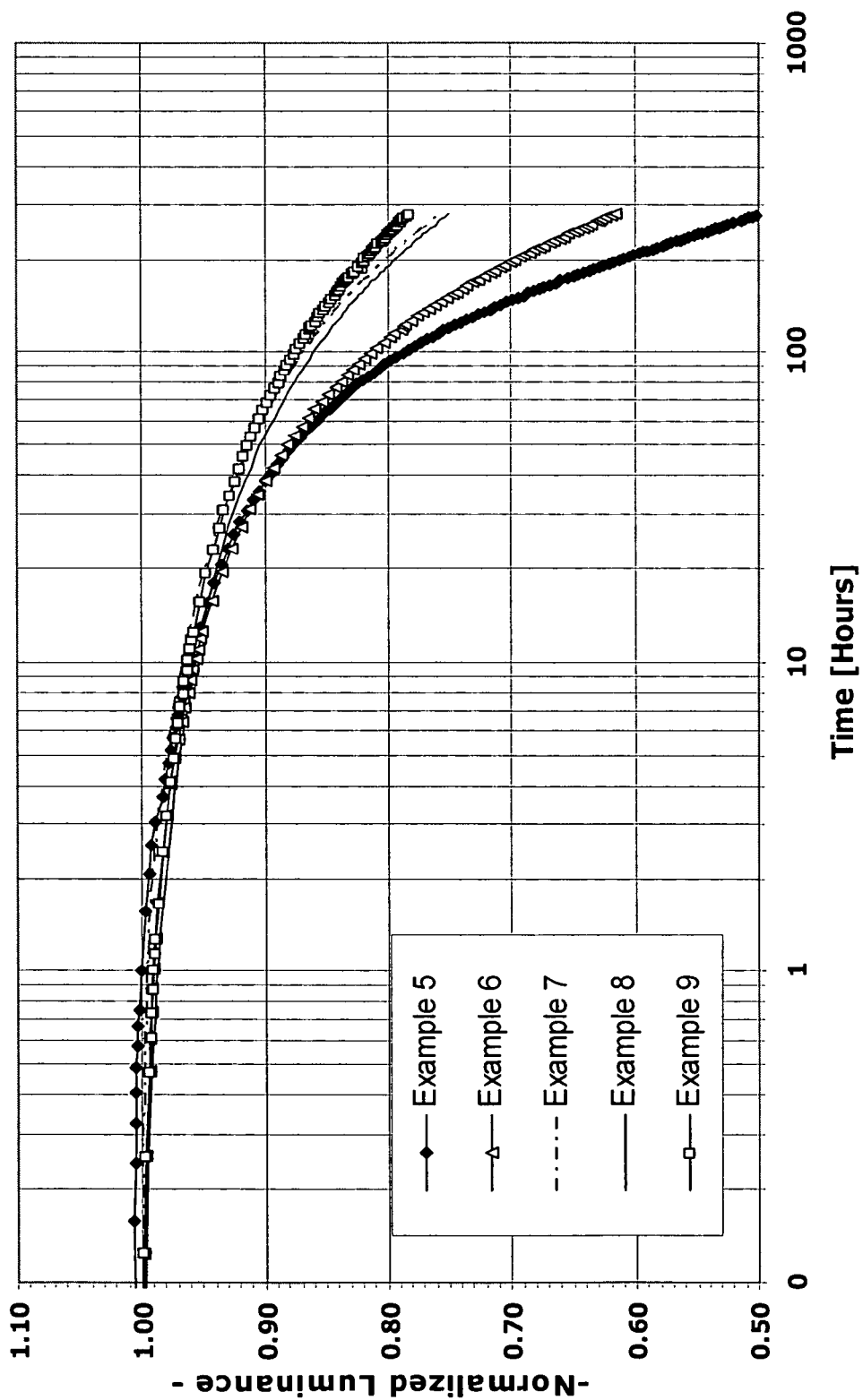
FIG. 8 shows normalized luminance decay for Example Devices 5-9 under constant current drive of 40 mA/cm$^2$ at room temperature.
Figure 9:
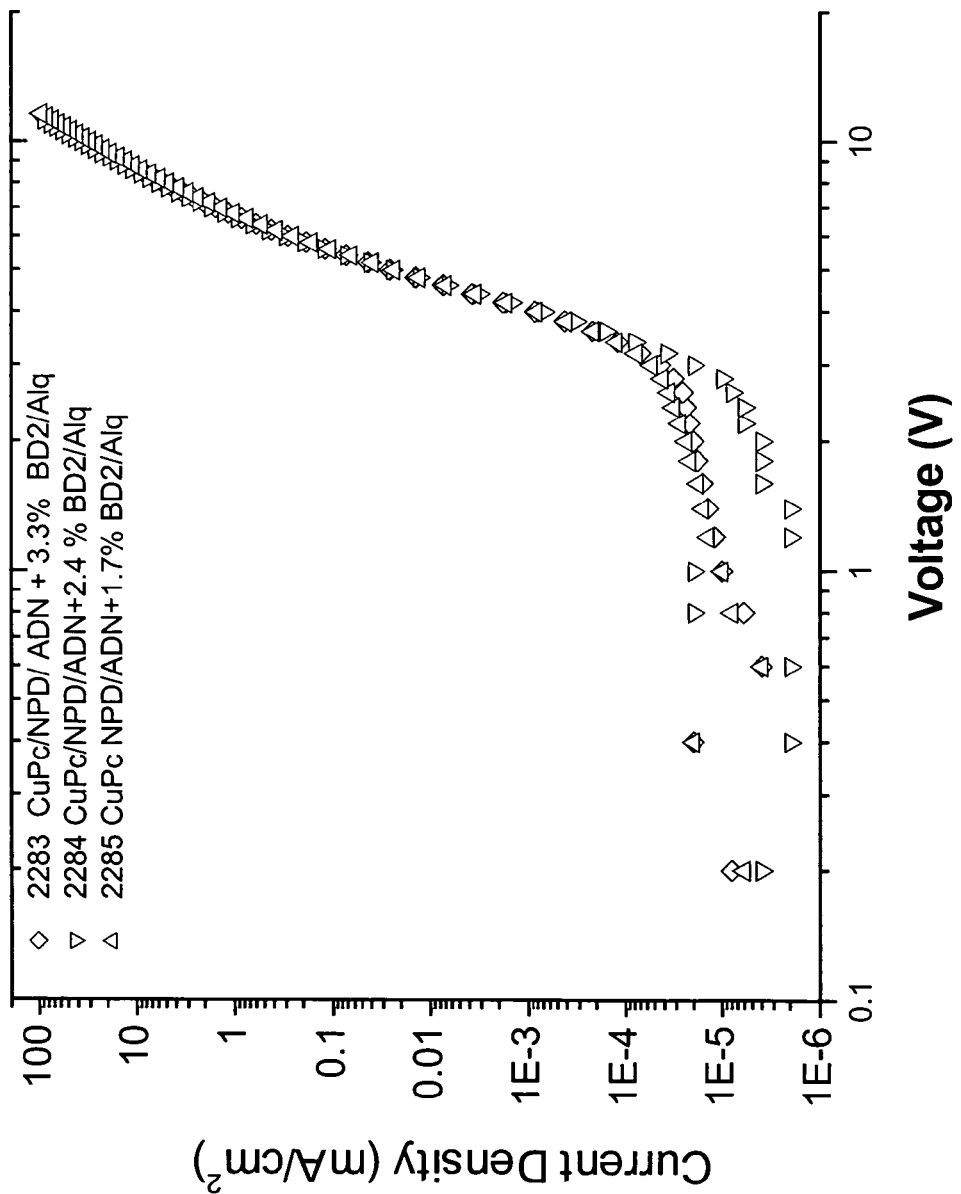
FIG. 9 shows plots comparing current density (mA/cm$^2$) vs. voltage (V) in Comparative Example Devices 1-3.
Figure 10:
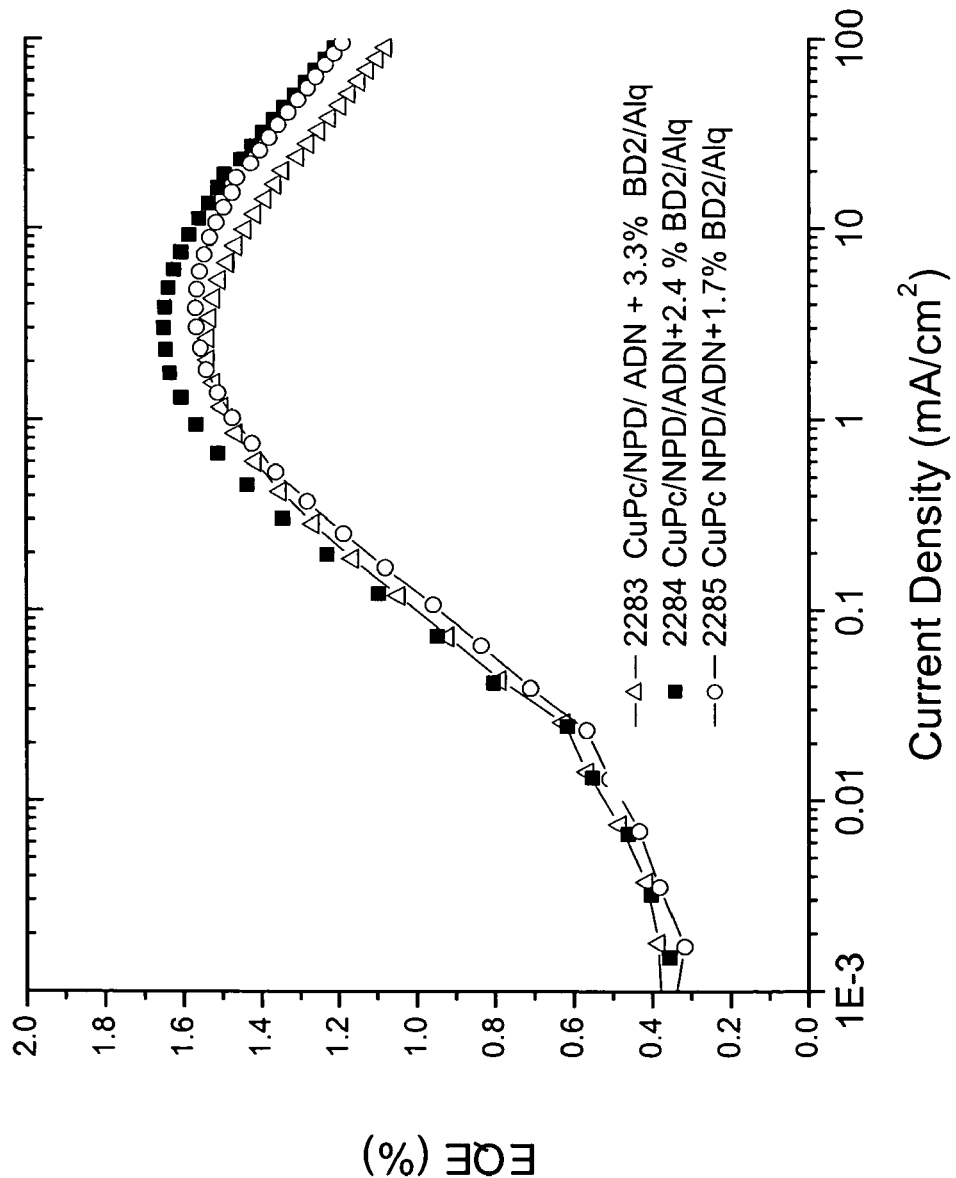
FIG. 10 shows the external quantum efficiency ($\eta_{ext}$) as a function of current density (mA/cm$^2$) for Comparative Examples Devices 1-3.
Figure 11:
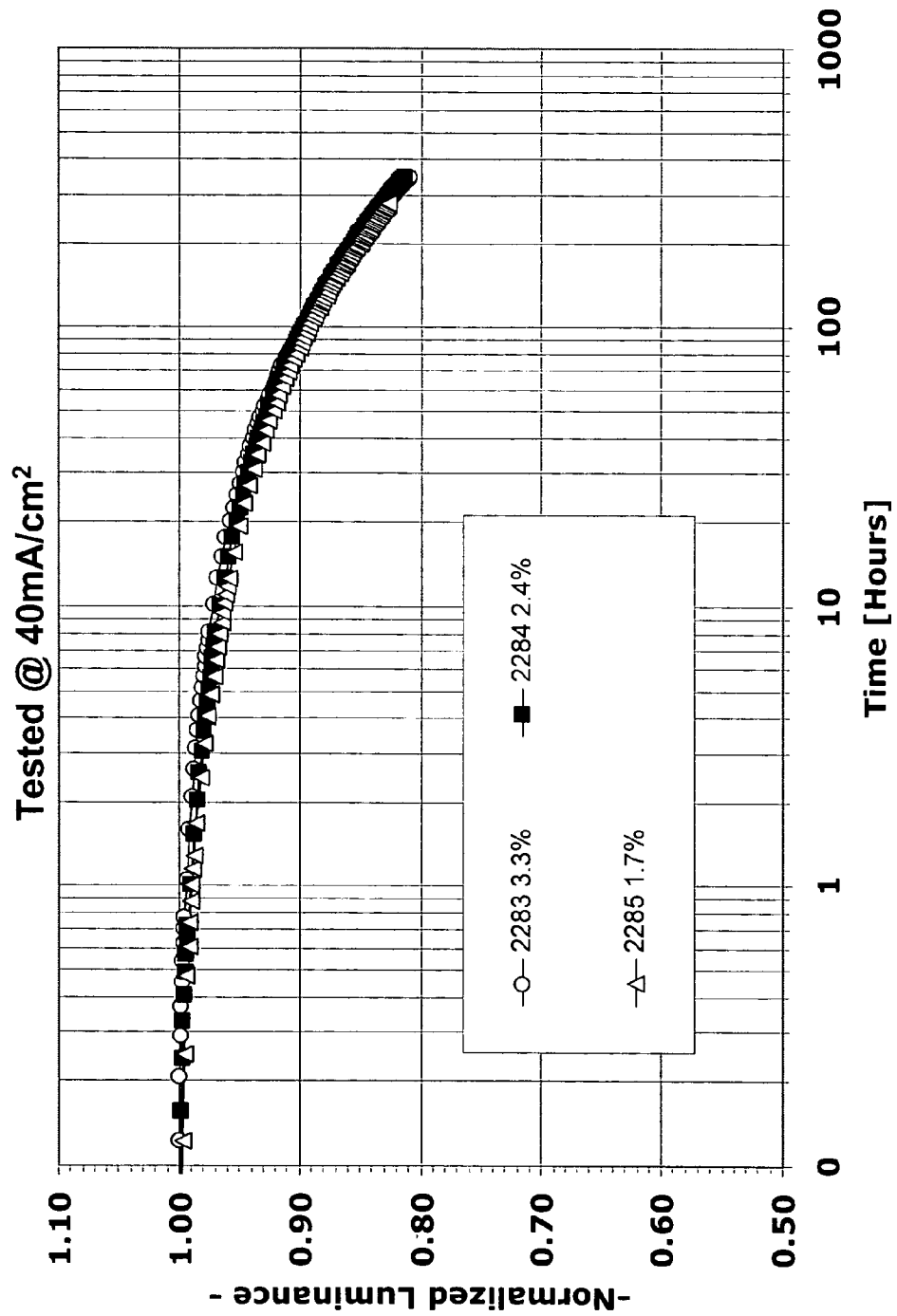
FIG. 11 shows normalized luminance decay for Comparative Example Devices 1-3 under constant current drive of 40 mA/cm$^2$ at room temperature.

The fluorescent devices of the present invention generally demonstrate characteristics comparable to or better than conventional fluorescent devices. FIGS. 3, 5, and 10 show the external quantum efficiency of Example Devices 1-4 (FIG. 3), Example Devices 5-9 (FIG. 5), and Comparative Example Devices 1-3 (FIG. 10). A comparison of FIGS. 3 and 10 shows that the external quantum efficiency of Example Devices 1-3 is comparable to Comparative Example Devices 1-3. Example Devices 4-7 performed notably well. FIGS. 4, 6, and 9 show the external quantum efficiency of Example Devices 1-4 (FIG. 4), Example Devices 5-9 (FIG. 6), and Comparative Example Devices 1-3 (FIG. 9). A comparison of FIGS. 4 and 9 demonstrates that, over a range of voltage, the current density of Example Devices 1-3 is comparable to Comparative Example Devices 1-3. FIGS. 7, 8, and 11 show the normalized luminance decay of Example Devices 1-4 (FIG. 7), Example Devices 5-9 (FIG. 8), and Comparative Example Devices 1-3 (FIG. 11). In terms of normalized luminance decay, a comparison of FIGS. 7 and 11 demonstrates that Example Devices 1-3 perform better than Comparative Example Devices 1-3.

Figure 12:
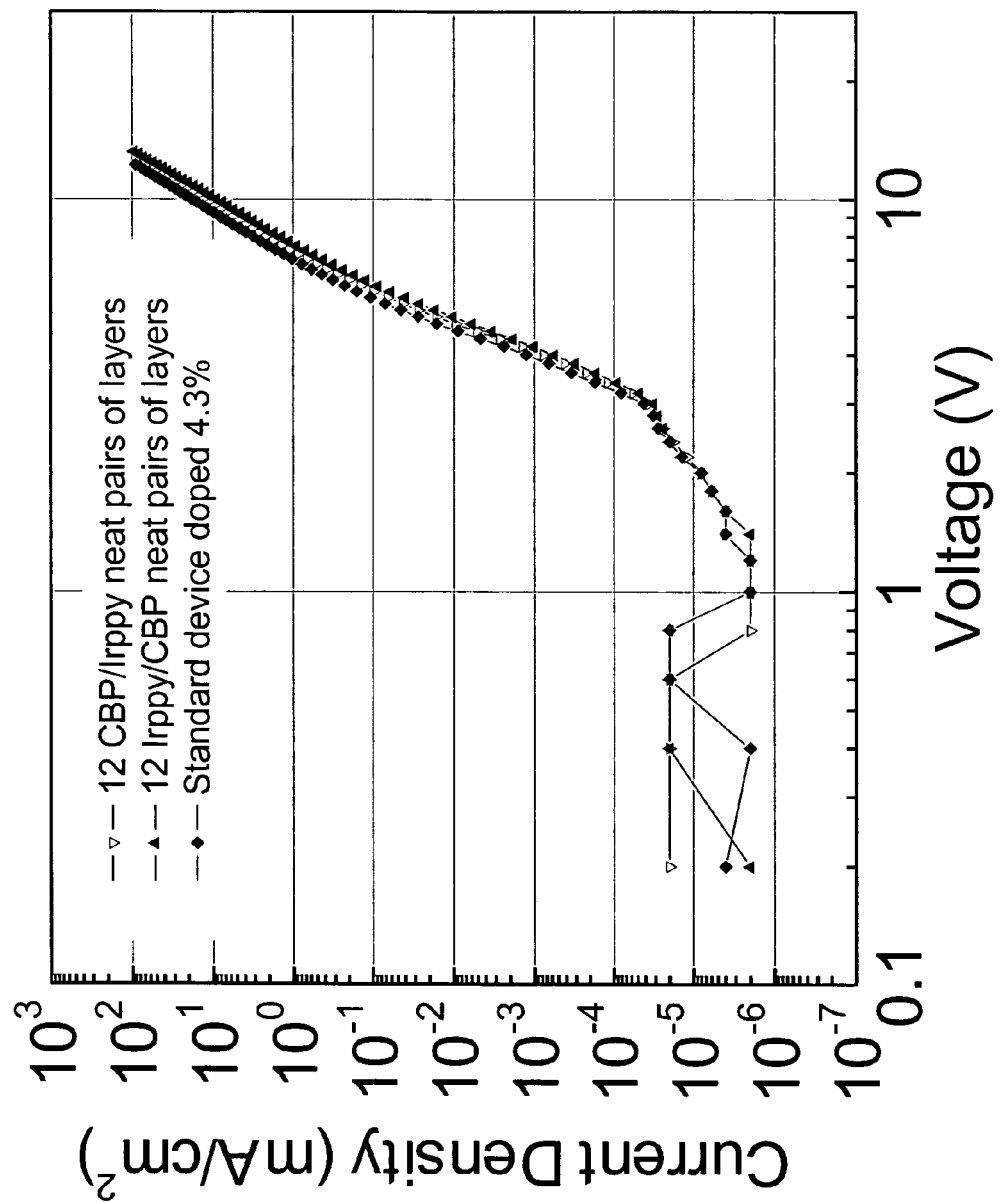
FIG. 12 shows plots comparing current density (mA/cm$^2$) vs. voltage (V) in Example Devices 10 and 11 and Comparative Example Device 4.
Figure 13:
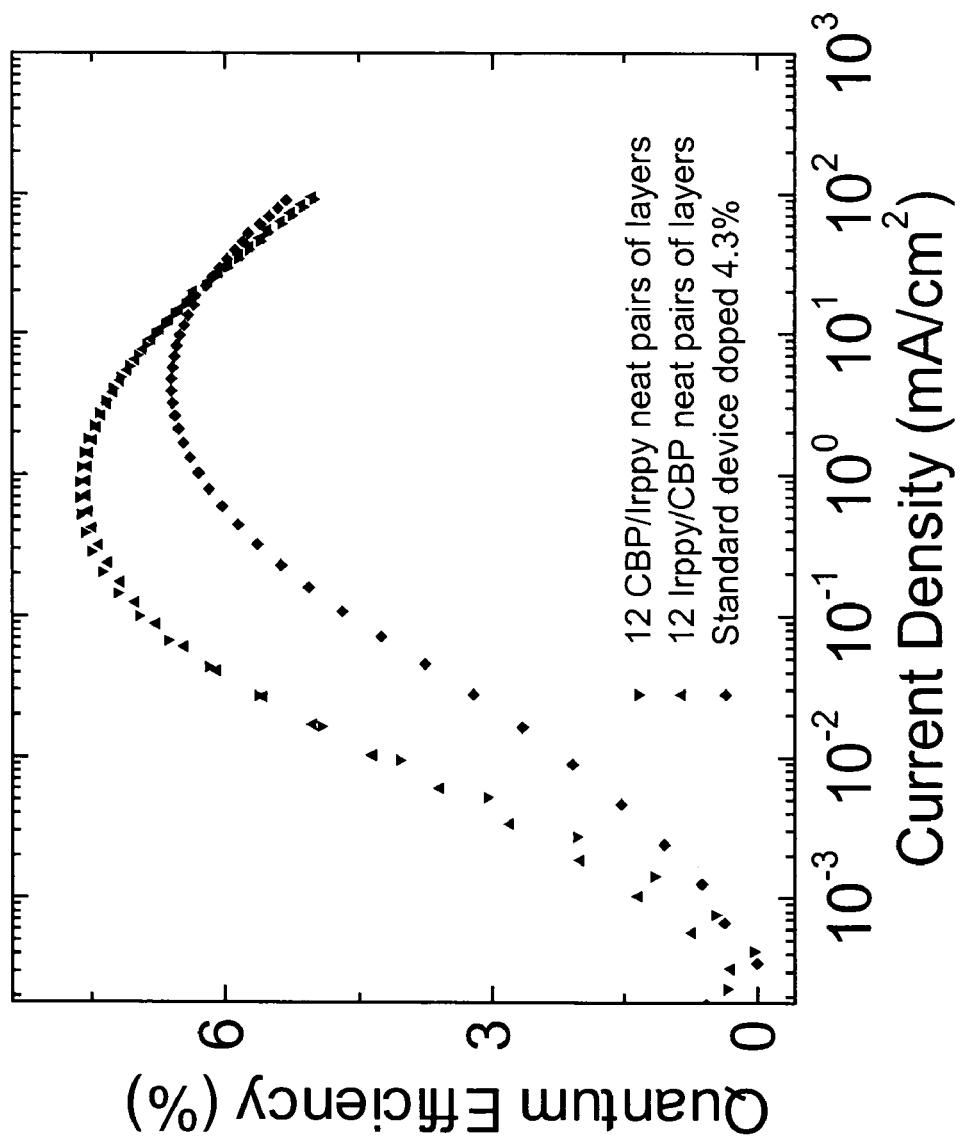
FIG. 13 shows the external quantum efficiency ($\eta_{ext}$) as a function of current density (mA/cm$^2$) comparing Example Devices 10 and 11 and Comparative Example Device 4.
Figure 14:
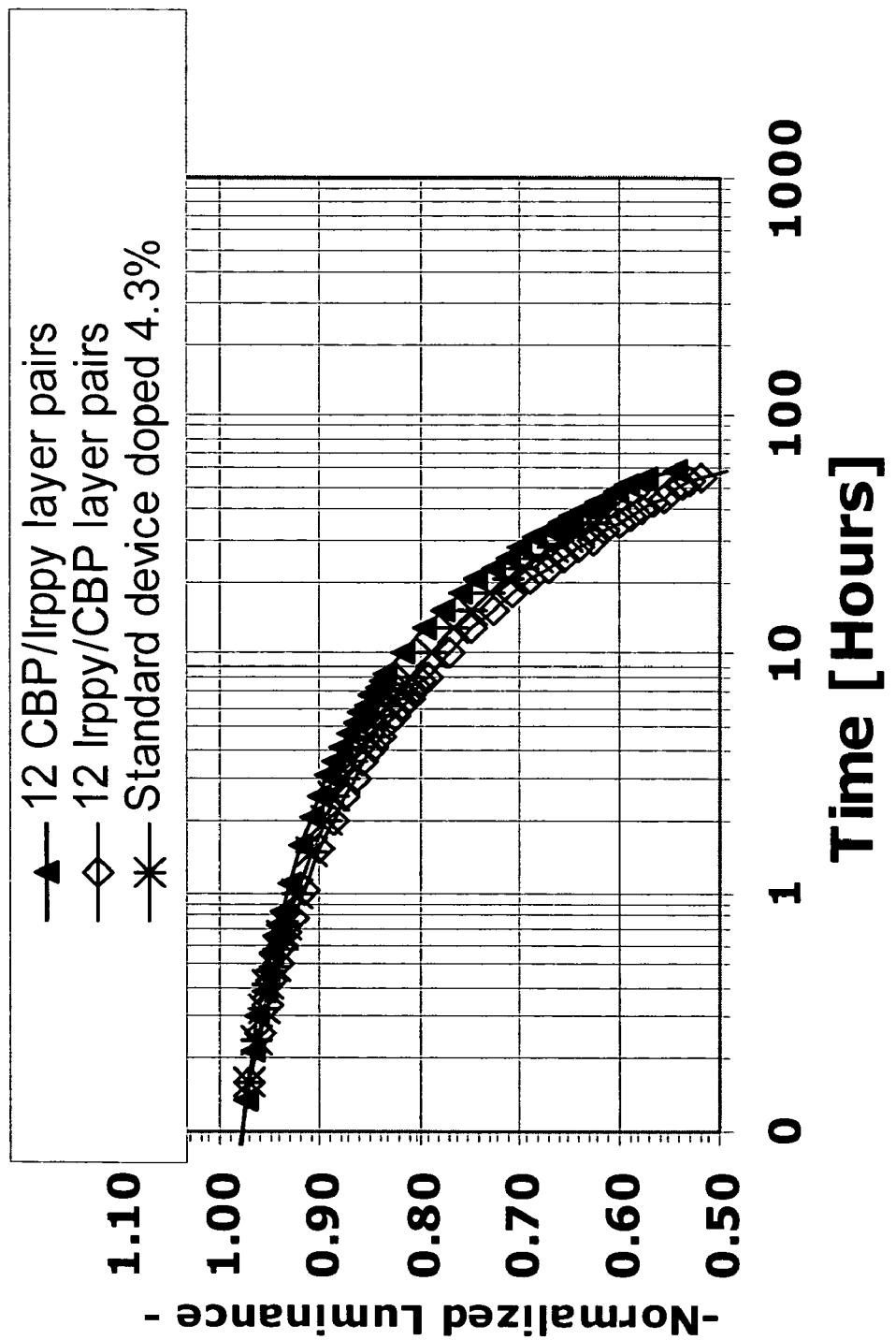
FIG. 14 shows normalized luminance decay comparing Example Devices 10 and 11 and Comparative Example Device 4 under constant current drive of 40 mA/cm2 at room temperature.
Figure 15:
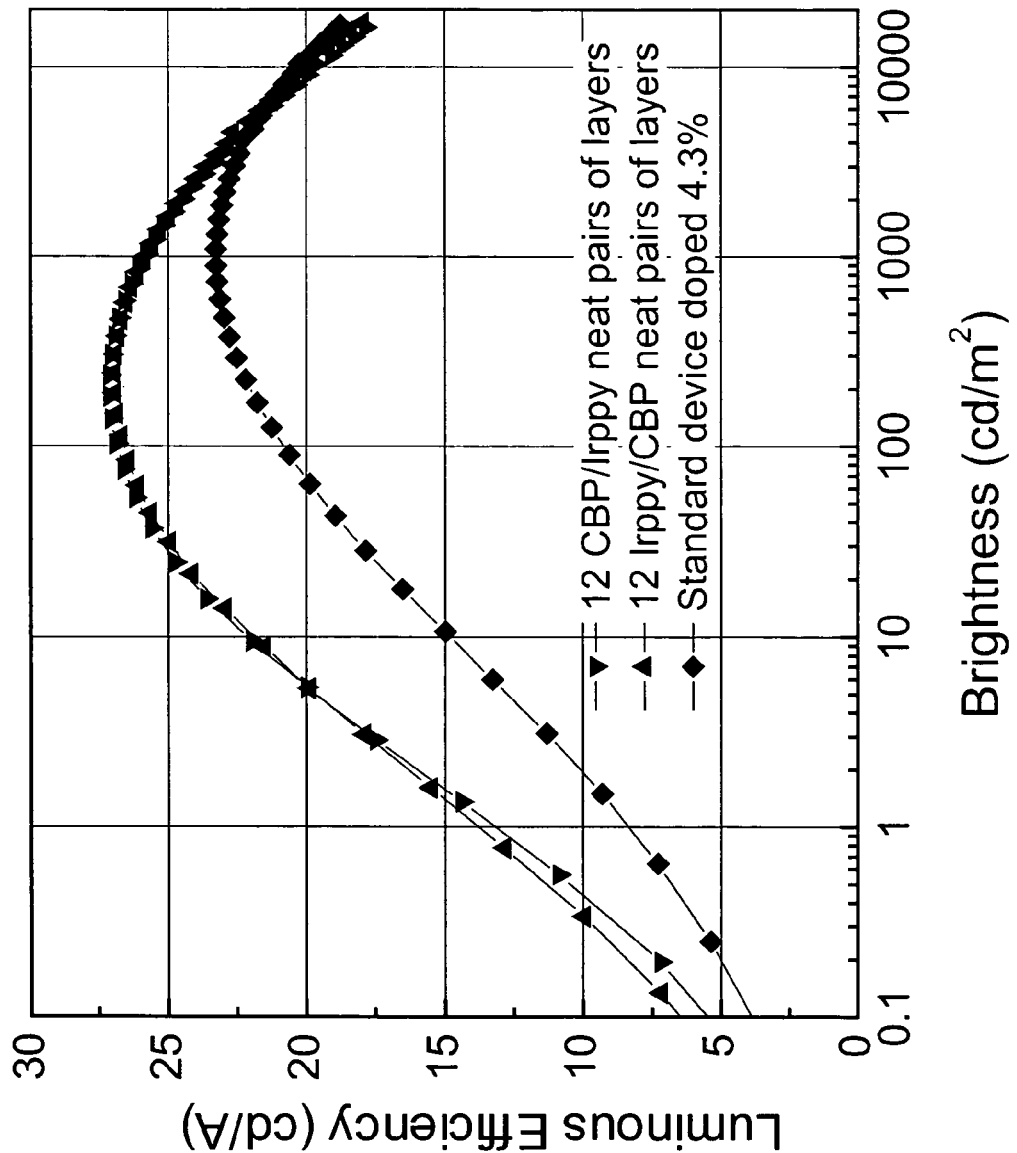
FIG. 15 shows plots comparing luminous efficiency (cd/A) vs. brightness (cd/m$^2$) comparing Example Devices 10 and 11 with Comparative Example Device 4.
Figure 16:
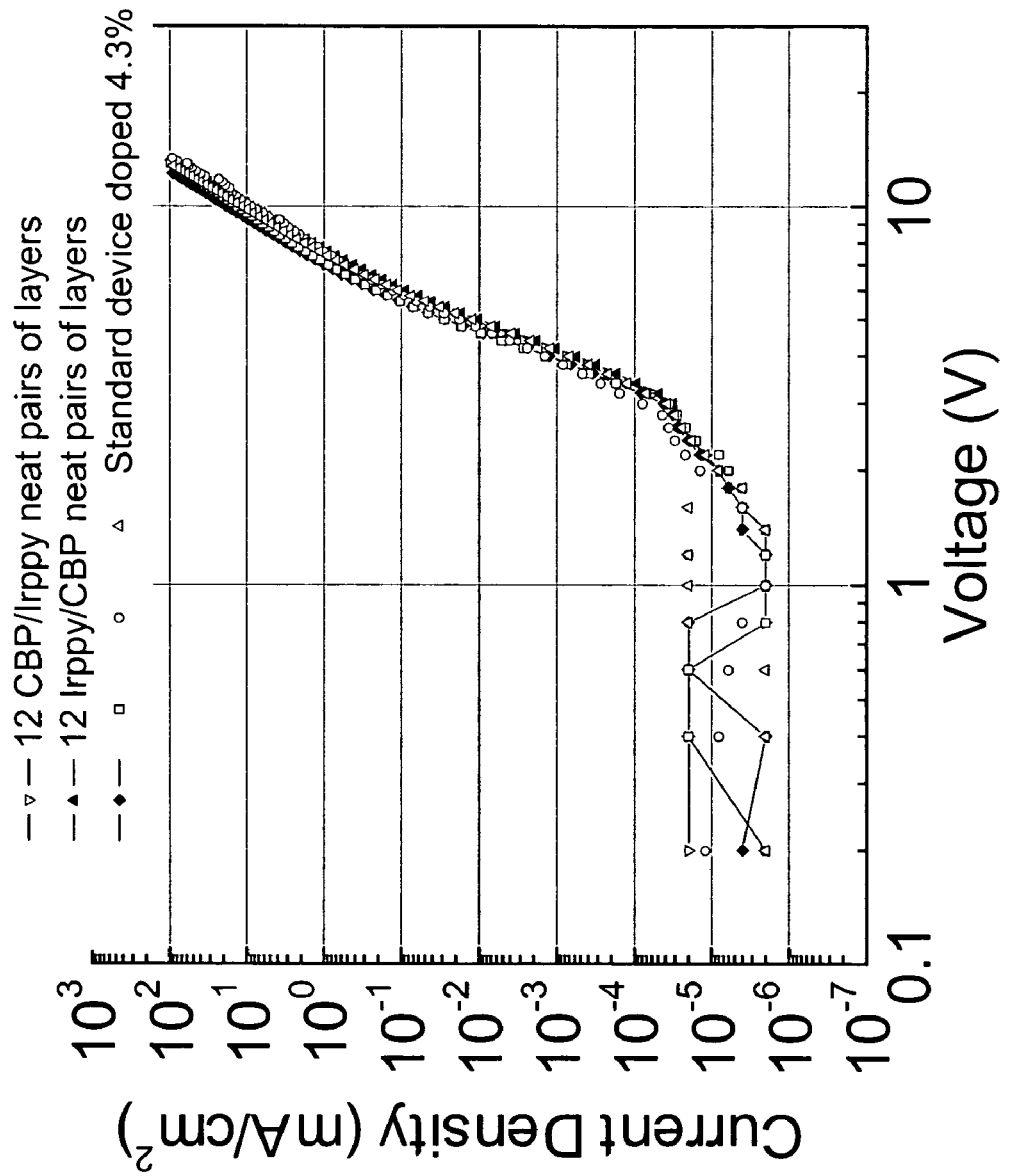
FIG. 16 shows plots comparing current density (mA/cm$^2$) vs. voltage (V) in Example Devices 10 and 11 and Comparative Example Devices 4-7.
Figure 17:
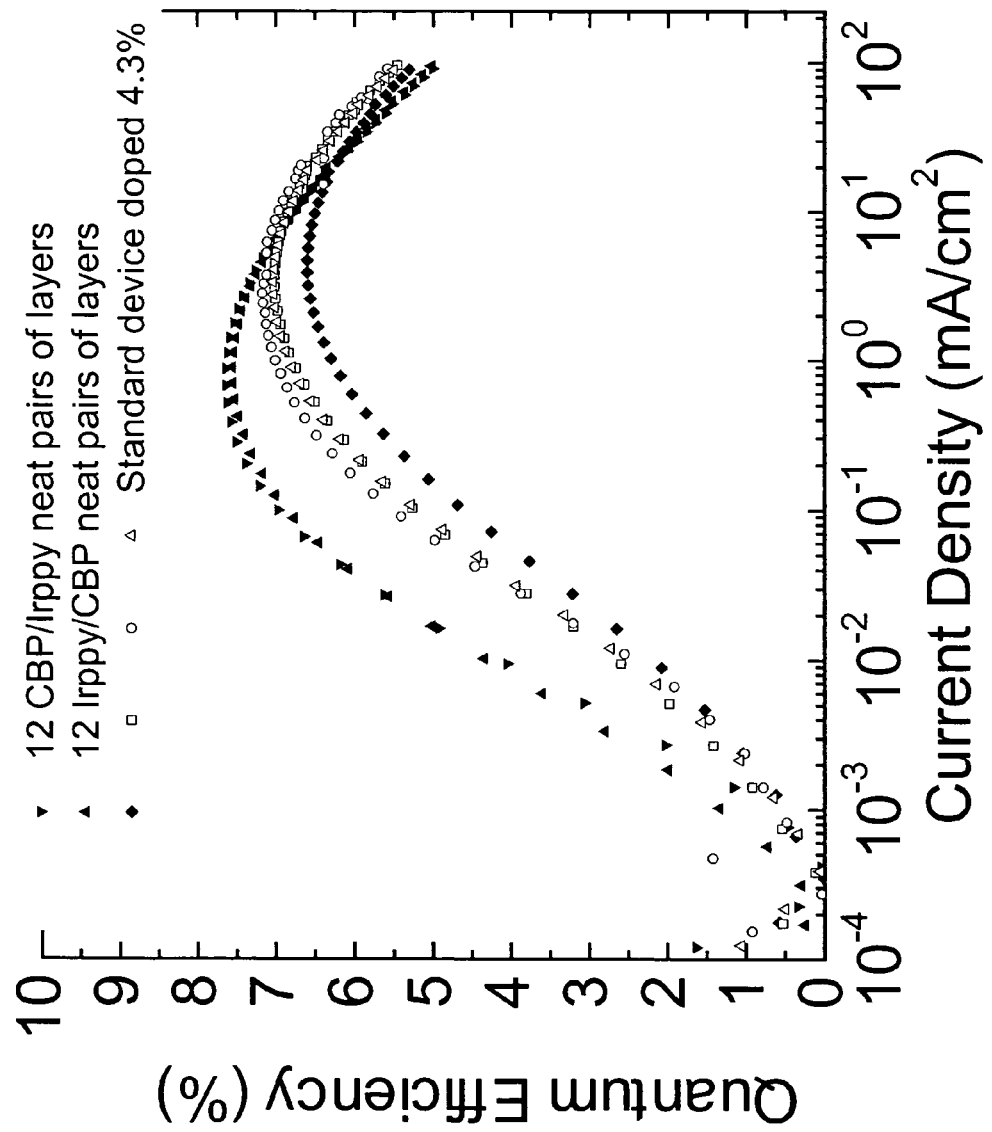
FIG. 17 shows the external quantum efficiency ($\eta_{ext}$) as a function of current density (mA/cm$^2$) comparing Example Devices 10 and 11 and Comparative Example Devices 4-7.
Figure 18:
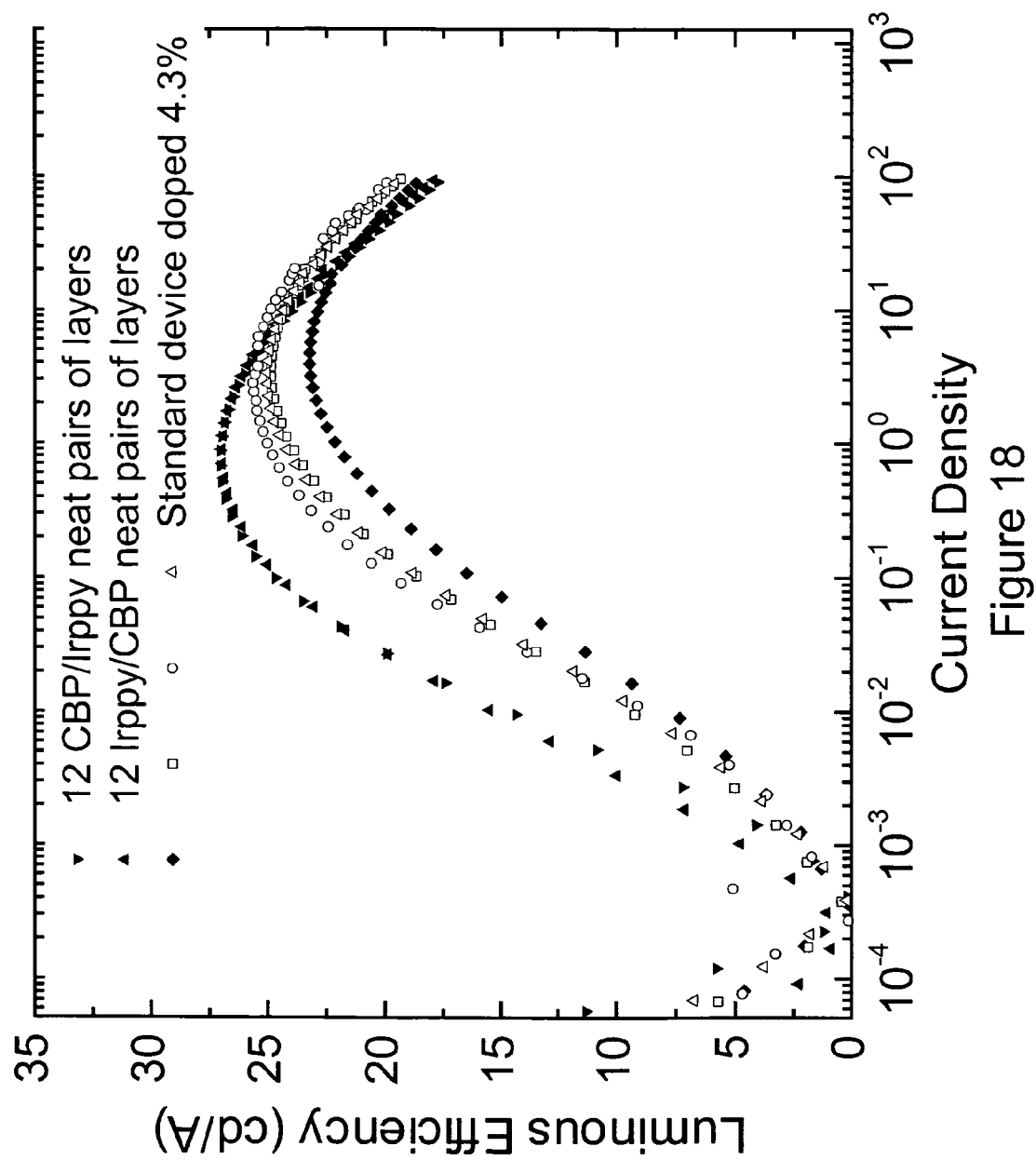
FIG. 18 shows plots comparing luminous efficiency (cd/A) vs. current density (mA/cm$^2$) comparing Example Devices 10 and 11 with Comparative Example Devices 4-7.

Similarly, the phosphorescent devices of the present invention generally demonstrate characteristics comparable to or better than conventional phosphorescent devices. FIGS. 13 and 17 show that the external quantum efficiency of Example Devices 10 and 11 is comparable to or better than Comparative Example Devices 4-7. FIGS. 12 and 16 show that, over a range of voltage, the current density of Example Devices 10 and 11 are comparable to Comparative Example Devices 4-7. In terms of normalized luminance decay, FIG. 14 shows that Example Devices 10 and 11 are comparable to Comparative Example Device 4. FIG. 15 shows that, over a range of brightness, the luminous efficiency of Example Devices 10 and 11 is comparable to or better than Comparative Example Device 4. Also, FIG. 18 shows that over a range of current density, the luminous efficiency of Example Devices 10 and 11 is comparable to or better than Comparative Example Devices 4-7.

Thus, FIGS. 1-18 demonstrate that Example Devices 1-11 show performance that is at least comparable to Comparative Example Devices 1-7. Moreover, Comparative Example Devices 1-7 are based on structures and doping concentrations that have been extensively optimized, whereas Example Devices 1-11 have not been extensively optimized. It is expected that further improvements in the performance of Example Devices 1-11 may be achieved through optimization.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising:
   (a) an anode;
   (b) a cathode;
   (c) a plurality of sets of organic layers disposed between the anode and the cathode, each set comprising:
      a non-continuous emissive layer of an emissive material without a host material which comprises spaces that are empty or occupied by molecules of another layer; and
      a neat non-emissive layer adjacent to and in physical contact with the non-continuous emissive layer,
      wherein the plurality of sets of organic layers are disposed in a manner such that the non-continuous emissive layers form a series of planar regions separated from each other by the neat non-emissive layers.

2. The device of claim 1, wherein each set consists of one non-continuous emissive layer and one neat non-emissive layer, such that the plurality of sets of organic layers comprises alternating non-continuous emissive layers and neat non-emissive layers.

3. The device of claim 1, wherein each non-continuous emissive layer includes the same organic emissive material.

4. The device of claim 1, wherein each neat non-emissive layer includes the same organic non-emissive material.

5. The device of claim 1, wherein the plurality of sets comprises 2 to 10 sets of organic layers.

6. The device of claim 1, wherein the plurality of sets comprises more than 10 sets of organic layers.

7. The device of claim 1, wherein each non-continuous emissive layer has a thickness of less than about 1 Å.

8. The device of claim 1, wherein each non-continuous emissive layer has an island structure.

9. The device of claim 1, wherein each non-continuous emissive layer has a mesh structure.

10. The device of claim 1, wherein each neat non-emissive layer has a thickness of about 10 to about 100 Å.

11. The device of claim 1, wherein each non-continuous emissive layer comprises a small molecule organic phosphorescent emissive material.

12. The device of claim 1, wherein each non-continuous emissive layer consists essentially of $Ir(ppy)_3$.

13. The device of claim 1, wherein each neat non-emissive layer consists essentially of CBP.

14. The device of claim 1, further comprising a hole transport layer disposed between the anode and the plurality of sets of organic layers.

15. The device of claim 1, further comprising an electron transport layer disposed between the plurality of sets of organic layers and the cathode.

16. The device of claim 1, wherein the non-continuous emissive layers are the only layers that emit light when an operating voltage is applied across the device.

17. The device of claim 1, wherein the device comprises:
   (a) an anode;
   (b) a layer consisting essentially of CuPc;
   (c) a layer consisting essentially of NPD;
   (d) a repeated set of organic layers alternating between a neat layer consisting essentially of CBP and a non-continuous layer consisting essentially of $Ir(ppy)_3$,
   (e) a layer consisting essentially of BAlq,
   (f) a layer consisting essentially of Alq, and
   (g) a cathode, disposed, in that order, over a substrate.

18. The device of claim 1, wherein at least one organic layer in the plurality of sets of organic layers is deposited by organic vapor phase deposition.

19. The device of claim 1, wherein at least one organic layer in the plurality of sets of organic layers is deposited by vacuum thermal evaporation.

20. The device of claim 1, wherein all layers are deposited by the same process.

21. An organic light emitting device, comprising:
   (a) an anode;
   (b) a cathode;
   (c) a plurality of sets of organic layers disposed between the anode and the cathode, each set comprising an emissive layer of an emissive material without a host material and a neat non-emissive layer, wherein said emissive layer is a non-continuous emissive layer which comprises spaces that are empty or occupied by molecules of another layer, wherein the plurality of sets of organic layers are disposed in a manner such that the non-continuous emissive layers form a series of planar regions separated from each other by the neat non-emissive layers, and wherein the energy gaps of the emissive layer and the non-emissive layer are not nested.

22. The device of claim 21, wherein the energy gaps of the emissive layer and the non-emissive layer partially overlap.

23. The device of claim 22, wherein the highest occupied molecular orbital level of the emissive layer is higher than the highest occupied molecular orbital level of the non-emissive layer, and the lowest unoccupied molecular orbital level of the emissive layer is higher than the lowest unoccupied molecular orbital level of the non-emissive layer.

24. The device of clam 21, wherein each non-continuous emissive layer has an island structure.

25. The device of claim 21, wherein each non-continuous emissive layer has a mesh structure.

26. An organic light emitting device, comprising:
   (a) an anode;
   (b) a cathode;
   (c) a plurality of sets of organic layers disposed between the anode and the cathode, each set comprising an emissive layer and a neat non-emissive layer, wherein the energy gaps of the emissive layer and the non-emissive layer are not nested, wherein the energy gaps of the emissive layer and the non-emissive layer partially overlap, wherein each emissive layer is continuous and wherein said emissive layer is formed by an emissive material without a host material, and wherein the plurality of sets of organic layers are disposed in a manner such that the emissive layers form a series of planar regions separated from each other by the neat non-emissive layers.

27. The device of claim 26, wherein each emissive layer has a thickness of at least one monolayer.

28. An organic light emitting device, comprising:
(a) an anode;
(b) a cathode;
(c) a plurality of sets of organic layers disposed between the anode and the cathode, each set comprising a layer of a first organic material and a neat layer of a second organic material, wherein said layer of said first organic material is a non-continuous layer which comprises spaces that are empty or occupied by molecules of another layer, wherein the plurality of sets of organic layers are disposed in a manner such that the layers of the first organic material form a series of planar regions separated from each other by the neat layers of the second organic material, and wherein the energy gaps of the first organic material and the second organic material are not nested.

29. The device of claim 28, wherein the energy gaps of the first organic material and the second organic material partially overlap.

30. The device of claim 28, wherein the highest occupied molecular orbital level of the first organic material is higher than the highest occupied molecular orbital level of the second organic material, and the lowest unoccupied molecular orbital level of the first organic material is higher than the lowest unoccupied molecular orbital level of the second organic material.

31. An organic light emitting device, comprising:
(a) an anode;
(b) a cathode;
(c) a plurality of sets of organic layers disposed between the anode and the cathode, each set comprising a layer of a first organic material and a layer of a second organic material, wherein said layer of said first organic material is a non-continuous layer which comprises spaces that are empty or occupied by molecules of another layer, wherein the plurality of sets of organic layers are disposed in a manner such that the layers of the first organic material form a series of planar regions separated from each other by the layers of the second organic material, and wherein the layer of the first organic material has a thickness of less than about 1 Å, and the layer of the second organic material has a thickness of about 10 to about 100 Å.

32. A method comprising:
(a) depositing an anode over a substrate;
(b) depositing a plurality of sets of organic layers over the anode, each set comprising a non-continuous emissive layer of an emissive material without a host material and a neat non-emissive layer, wherein each layer is deposited sequentially, wherein said non-continuous emissive layer comprises spaces that are empty or occupied by molecules of another layer, and wherein the plurality of sets of organic layers are disposed in a manner such that the non-continuous emissive layers form a series of planar regions separated from each other by the neat non-emissive layers; and
(c) depositing a cathode over the plurality of sets of organic layers.

33. The method of claim 32, wherein depositing comprises organic vapor phase deposition.

34. The method of claim 32, wherein depositing comprises vacuum thermal evaporation.

35. A method comprising:
(a) depositing an anode over a substrate;
(b) depositing a plurality of sets of organic layers over the anode, each set comprising an emissive layer of an emissive material without a host material and a neat non-emissive layer, wherein the energy gaps of the emissive layer and the non-emissive layer are not nested, wherein said emissive layer is a non-continuous emissive layer which comprises spaces that are empty or occupied by molecules of another layer, wherein each layer is deposited sequentially, and wherein the plurality of sets of organic layers are disposed in a manner such that the non-continuous emissive layers form a series of planar regions separated from each other by the neat non-emissive layers; and
(c) depositing a cathode over the plurality of sets of organic layers.

36. The method of claim 35, wherein depositing comprises organic vapor phase deposition.

37. The method of claim 35, wherein depositing comprises vacuum thermal evaporation.

38. An organic light emitting device made by the process comprising:
(a) depositing an anode over a substrate;
(b) depositing a plurality of sets of organic layers over the anode, each set comprising a non-continuous emissive layer of an emissive material without a host material and a neat non-emissive layer, wherein said emissive layer is a non-continuous emissive layer which comprises spaces that are empty or occupied by molecules of another layer, wherein the plurality of sets of organic layers are disposed in a manner such that the non-continuous emissive layers form a series of planar regions separated from each other by the neat non-emissive layers, and wherein each layer is deposited sequentially and in physical contact with the other layer in the set; and
(c) depositing a cathode over the plurality of sets of organic layers.

39. An organic light emitting device made by the process comprising:
(a) depositing an anode over a substrate;
(b) depositing a plurality of sets of organic layers over the anode, each set comprising an emissive layer of an emissive material without a host material and a neat non-emissive layer, wherein the energy gaps of the emissive layer and the non-emissive layer are not nested, wherein said emissive layer is a non-continuous emissive layer which comprises spaces that are empty or occupied by molecules of another layer, wherein each layer is deposited sequentially, and wherein the plurality of sets of organic layers are disposed in a manner such that the non-continuous emissive layers form a series of planar regions separated from each other by the neat non-emissive layers; and
(c) depositing a cathode over the plurality of sets of organic layers.

40. The device of claim 1, wherein each non-continuous emissive layer has a thickness less than the size of a single molecule of the emissive material, wherein said thickness is calculated by the total thickness of the plurality of sets of organic layers multiplied by the volume percent of the emissive material.

41. The device of claim 1, wherein each non-continuous emissive layer consists essentially of the emissive material.

42. The device of claim 1, wherein each non-continuous emissive layer consists essentially of a single emissive material.

43. The device of claim 1, wherein each non-continuous emissive layer consists essentially of the emissive material and a non-emissive material from an adjacent non-emissive layer.

* * * * *